US012784819B2

(12) United States Patent
Mototani

(10) Patent No.: US 12,784,819 B2
(45) Date of Patent: Nov. 3, 2026

(54) SEMICONDUCTOR MEMORY DEVICE

(71) Applicant: Nuvoton Technology Corporation Japan, Kyoto (JP)

(72) Inventor: Atsushi Mototani, Osaka (JP)

(73) Assignee: Nuvoton Technology Corporation Japan, Kyoto (JP)

(*) Notice: Subject to any disclaimer, the term of this patent is extended or adjusted under 35 U.S.C. 154(b) by 103 days.

(21) Appl. No.: 19/050,828

(22) Filed: Feb. 11, 2025

(65) Prior Publication Data

US 2025/0182820 A1 Jun. 5, 2025

Related U.S. Application Data

(63) Continuation of application No. PCT/JP2023/031714, filed on Aug. 31, 2023.

(30) Foreign Application Priority Data

Sep. 16, 2022 (JP) ................................ 2022-148483

(51) Int. Cl.

| | |
|---|---|
| ***G11C 11/00*** | (2006.01) |
| ***G11C 5/06*** | (2006.01) |
| ***G11C 7/04*** | (2006.01) |
| ***G11C 8/08*** | (2006.01) |
| ***G11C 11/418*** | (2006.01) |
| ***G11C 11/419*** | (2006.01) |

(52) U.S. Cl.

CPC ............ *G11C 11/418* (2013.01); *G11C 5/063* (2013.01); *G11C 7/04* (2013.01); *G11C 8/08* (2013.01); *G11C 11/419* (2013.01)

(58) Field of Classification Search

CPC ..... G11C 11/418; G11C 5/063; G11C 11/419; G11C 7/04; G11C 8/08

USPC .......................................................... 365/154

See application file for complete search history.

(56) References Cited

U.S. PATENT DOCUMENTS 4,879,690 A 11/1989 Anami et al.
9,424,910 B2 * 8/2016 Yabuuchi ............. G11C 11/419
(Continued)

FOREIGN PATENT DOCUMENTS

EP 3621076 B1 * 9/2022
JP H02-053880 B2 11/1990
(Continued)

OTHER PUBLICATIONS

International Search Report dated Oct. 31, 2023 issued in International Patent Application No. PCT/JP2023/031714, with English translation.

*Primary Examiner* — Viet Q Nguyen

(74) *Attorney, Agent, or Firm* — Rimon P.C.

(57) ABSTRACT

A semiconductor memory device includes: a first pull-down n-channel MOS transistor that includes: a drain connected to a word line; a source connected to a ground line; and a gate connected to a first node; a first series connection n-channel MOS transistor that includes: a drain connected to a power supply line; and a source connected to the first node; and a second series connection n-channel MOS transistor that includes: a drain connected to the first node; and a source connected to the ground line. The inverse-logic signal of a signal to be input to the gate of the second series connection n-channel MOS transistor is input to the gate of the first series connection n-channel MOS transistor.

13 Claims, 29 Drawing Sheets

(56) References Cited

U.S. PATENT DOCUMENTS

| | | | | |
|---|---|---|---|---|
| 9,865,333 | B2 * | 1/2018 | Dhori | G11C 11/419 |
| 9,928,898 | B2 * | 3/2018 | Sahu | G11C 8/08 |
| 9,940,997 | B2 * | 4/2018 | Kumar | G11C 11/419 |
| 9,997,236 | B1 * | 6/2018 | Pathak | G11C 11/419 |
| 10,658,026 | B2 * | 5/2020 | Singh | G11C 11/418 |
| 10,679,694 | B2 * | 6/2020 | Kumar | H10B 10/12 |
| 10,685,703 | B2 * | 6/2020 | Singh | G11C 8/08 |
| 10,854,280 | B2 * | 12/2020 | Singh | G11C 11/419 |
| 11,264,087 | B2 * | 3/2022 | Yokoyama | G11C 5/063 |
| 11,404,112 | B2 * | 8/2022 | Wang | G11C 5/147 |
| 11,682,453 | B2 * | 6/2023 | Singh | G11C 11/418 365/154 |
| 11,721,380 | B2 * | 8/2023 | Taghvaei | G11C 11/40 365/72 |
| 12,431,191 | B2 * | 9/2025 | Chang | G11C 11/418 |
| 12,469,549 | B2 * | 11/2025 | Kumar | G11C 11/418 |
| 12,537,046 | B2 * | 1/2026 | Schreiber | G11C 11/4076 |
| 2007/0030741 | A1 | 2/2007 | Nii et al. | |
| 2008/0253172 | A1 | 10/2008 | Yamagami | |
| 2019/0066772 | A1 * | 2/2019 | Singh | G11C 11/418 |

FOREIGN PATENT DOCUMENTS

| | | | | | |
|---|---|---|---|---|---|
| JP | 2662800 | B2 | | 10/1997 | |
| JP | 2007066493 | A | * | 3/2007 | G11C 11/413 |
| JP | 2008-262637 | A | | 10/2008 | |
| JP | 2011216172 | A | * | 10/2011 | |

* cited by examiner

SEMICONDUCTOR MEMORY DEVICE

CROSS REFERENCE TO RELATED APPLICATIONS

This is a continuation application of PCT International Application No. PCT/JP2023/031714 filed on Aug. 31, 2023, designating the United States of America, which is based on and claims priority of Japanese Patent Application No. 2022-148483 filed on Sep. 16, 2022. The entire disclosures of the above-identified applications, including the specifications, drawings and claims are incorporated herein by reference in their entirety.

FIELD

The present disclosure relates to a semiconductor memory device and, in particular, to a static random access memory (SRAM).

BACKGROUND

Conventionally, a technique of decreasing the voltage by pulling down the voltage of a word line in an active state is known as a technique of improving the static noise margin (SNM) in SRAM.

CITATION LIST

Patent Literature

PTL 1: Japanese Unexamined Patent Application Publication No. 2008-262637

SUMMARY

Technical Problem

In SRAM, when the voltage of a word line in an active state is decreased to improve the SNM, the capability to write to a memory cell and the capability to read out from the memory cell (hereinafter, also referred to as read and write capability) are decreased.

In view of this, the present disclosure aims to provide a semiconductor memory device that achieves a voltage drop of a word line to improve the SNM, the voltage drop being such that the read and write capability can be suppressed from decreasing.

Solution to Problem

A semiconductor memory device according to one aspect of the present disclosure includes: a first pull-down n-channel metal-oxide-semiconductor (MOS) transistor that includes: a drain connected to a first word line connected to one or more first memory cells; a source connected to a ground line that supplies a ground voltage; and a gate connected to a first node; a first series connection n-channel MOS transistor that includes: a drain connected to a power supply line that supplies a power supply voltage; and a source connected to the first node; and a second series connection n-channel MOS transistor that includes: a drain connected to the first node; and a source connected to the ground line, in which the inverse-logic signal of a signal to be input to the gate of the second series connection n-channel MOS transistor is input to the gate of the first series connection n-channel MOS transistor.

A semiconductor memory device according to another aspect of the present disclosure includes: a first pull-down n-channel metal-oxide-semiconductor (MOS) transistor that includes: a drain connected to a first word line connected to one or more first memory cells; a source connected to a ground line that supplies a ground voltage; and a gate connected to a first node; a first p-channel MOS transistor that includes: a source connected to a power supply line that supplies a power supply voltage; and a drain connected to a second node; a first series connection n-channel MOS transistor that includes: a drain connected to the second node; a source connected to the first node; and a gate connected to a first control signal input terminal to which a first control signal is to be input; and a second series connection n-channel MOS transistor that includes: a drain connected to the first node; and a source connected to the ground line, in which a signal with the same logic as a signal to be input to the gate of the second series connection n-channel MOS transistor is input to the gate of the first p-channel MOS transistor.

Advantageous Effects

A semiconductor memory device according to one aspect of the present disclosure is a semiconductor memory device that achieves a voltage drop of the word line to improve the SNM, the voltage drop being such that the read and write capability can be suppressed from decreasing.

BRIEF DESCRIPTION OF DRAWINGS

These and other advantages and features will become apparent from the following description thereof taken in conjunction with the accompanying Drawings, by way of non-limiting examples of embodiments disclosed herein.

Figure 1:
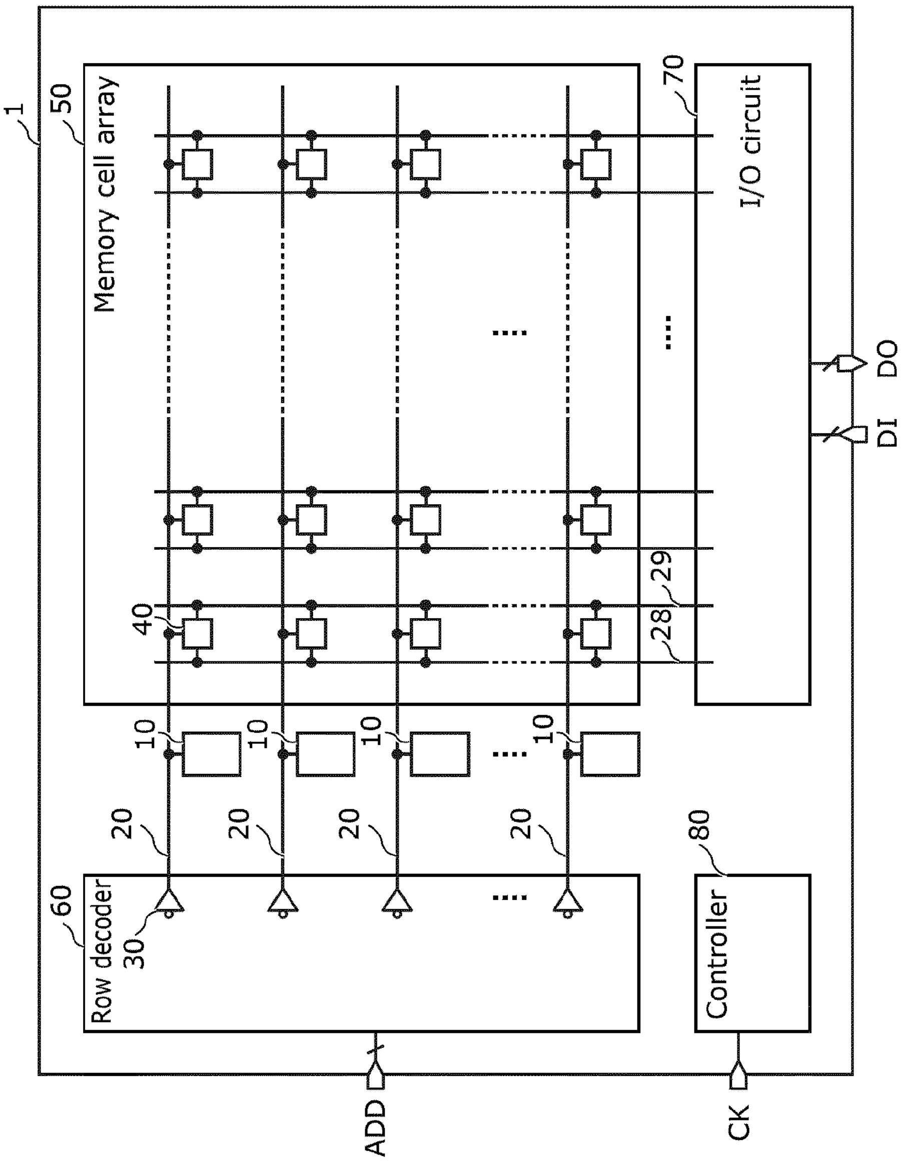
FIG. 1 is a block diagram illustrating a configuration of a semiconductor memory device according to Embodiment 1.

DESCRIPTION OF EMBODIMENTS (Circumstances Leading to One Aspect of the Present Disclosure)

Generally, the SNM is low when a temperature condition is a high-temperature condition and when a process variation condition is that an n-channel metal-oxide-semiconductor (MOS) transistor is fast (the threshold voltage of the n-channel MOS transistor is low).

Moreover, generally, the read and write capability decreases when the temperature condition is a low-temperature condition and when the process variation condition is that the n-channel MOS transistor is slow (the threshold voltage of the n-channel MOS transistor is high).

From the above, with regard to SRAM, the inventors considered that it may be possible to suppress the read and write capability from decreasing without reducing the SNM, if it is possible to control the voltage drop of a word line in the following manner: the voltage drop of the word line in an active state is smaller when the temperature condition is the low-temperature condition than when the temperature condition is the high-temperature condition, and the voltage drop of the word line in an active state is smaller when the process variation condition is that an n-channel MOS transistor is slow than when the process variation condition is that the n-channel MOS transistor is fast.

Thus, on the basis of the above thoughts, the inventors diligently repeated experiments and analysis with regard to a semiconductor memory device that achieves a voltage drop of a word line to improve the SNM, the voltage drop being such that the read and write capability can be suppressed from decreasing.

As a result, the inventors arrived at the following semiconductor memory devices according to the present disclosure.

A semiconductor memory device according to one aspect of the present disclosure includes: a first pull-down n-channel metal-oxide-semiconductor (MOS) transistor that includes: a drain connected to a first word line connected to one or more first memory cells; a source connected to a ground line that supplies a ground voltage; and a gate connected to a first node; a first series connection n-channel MOS transistor that includes: a drain connected to a power supply line that supplies a power supply voltage; and a source connected to the first node; and a second series connection n-channel MOS transistor that includes: a drain connected to the first node; and a source connected to the ground line, in which the inverse-logic signal of a signal to be input to the gate of the second series connection n-channel MOS transistor is input to the gate of the first series connection n-channel MOS transistor.

In the semiconductor memory device configured as above, the voltage of the first node, that is, the gate voltage of the first pull-down n-channel MOS transistor is a voltage (VDD-Vtn) that is lower by the threshold voltage (hereinafter, also referred to as Vtn) of the n-channel MOS transistor than the power supply voltage (hereinafter, also referred to as VDD).

Generally, Vtn is larger under the low-temperature condition than under the high-temperature condition, and is larger under the condition that the n-channel MOS transistor is slow than under the condition that the n-channel MOS transistor is fast.

Thus, the gate voltage of the first pull-down n-channel MOS transistor is lower when the temperature condition is the low-temperature condition than when the temperature condition is the high-temperature condition, and is lower when the process variation condition is that the n-channel MOS transistor is slow than when the process variation condition is that the n-channel MOS transistor is fast.

In the semiconductor memory device configured as above, the first pull-down n-channel MOS transistor pulls down, according to the gate voltage thereof, the voltage of the first word line in an active state such that the lower the gate voltage, the smaller the pull-down voltage of the first word line in an active state.

Accordingly, in the semiconductor memory device configured as above, the voltage drop of the first word line in an active state is controlled such that the voltage drop of the first word line is smaller when the temperature condition is the low-temperature condition than when the temperature condition is the high-temperature condition and such that the voltage drop of the first word line is smaller when the process variation condition is that the n-channel MOS transistor is slow than when the process variation condition is that the n-channel MOS transistor is fast.

In this way, the semiconductor memory device configured as above is a semiconductor memory device that achieves a voltage drop of a word line to improve the SNM, the voltage drop being such that the read and write capability can be suppressed from decreasing.

The semiconductor memory device may further include: a first p-channel MOS transistor that includes: a drain connected to the drain of the first series connection n-channel MOS transistor; a source connected to the power supply line; and a gate connected to a first control signal input terminal to which a first control signal is to be input, in which the drain of the first series connection n-channel MOS transistor may be connected to the power supply line via the first p-channel MOS transistor.

In this way, by controlling the first control signal, it is possible to perform control as to whether to pull down the voltage of the first word line by using the first pull-down n-channel MOS transistor.

The semiconductor memory device may further include: a second pull-down n-channel MOS transistor that includes: a drain connected to a second word line connected to one or more second memory cells; a source connected to the ground line; and a gate connected to a second node; a third series connection n-channel MOS transistor that includes: a drain connected to the drain of the first p-channel MOS transistor; and a source connected to the second node; and a fourth series connection n-channel MOS transistor that includes: a drain connected to the second node; and a source connected to the ground line, in which the inverse-logic signal of a signal to be input to the gate of the fourth series connection n-channel MOS transistor may be input to the gate of the third series connection n-channel MOS transistor.

In the semiconductor memory device configured as above, a p-channel MOS transistor positioned in the current path between the power supply line and the first node and a p-channel MOS transistor positioned in the current path between the power supply line and the second node can made as the common transistor, the first p-channel MOS transistor.

In this way, it is possible to reduce the area for making the p-channel MOS transistor, in comparison with the case where the p-channel MOS transistor positioned in the current path between the power supply line and the first node and the p-channel MOS transistor positioned in the current path between the power supply line and the second node are made as separate transistors.

The semiconductor memory device may further include: a second pull-down n-channel MOS transistor that includes: a drain connected to a second word line connected to one or more second memory cells; a source connected to the ground line; and a gate connected to the first node; a third pull-down n-channel MOS transistor that includes: a drain connected to a third word line connected to one or more third memory cells; a source connected to the ground line; and a gate connected to a second node; a fourth pull-down n-channel MOS transistor that includes: a drain connected to a fourth word line connected to one or more fourth memory cells; a source connected to the ground line; and a gate connected to the second node; a third series connection n-channel MOS transistor that includes: a drain connected to the drain of the first p-channel MOS transistor; and a source connected to the second node; and a fourth series connection n-channel MOS transistor that includes: a drain connected to the second node; and a source connected to the ground line, in which when at least one of the first word line or the second word line is active, the inverse-logic signal of a signal to be input to the gate of the second series connection n-channel MOS transistor may be input to the gate of the first series connection n-channel MOS transistor, and when at least one of the third word line or the fourth word line is active, the inverse-logic signal of a signal to be input to the gate of the fourth series connection n-channel MOS transistor may be input to the gate of the third series connection n-channel MOS transistor.

In the semiconductor memory device configured as above, a p-channel MOS transistor positioned in the current path between the power supply line and the first node and a p-channel MOS transistor positioned in the current path between the power supply line and the second node can made as the common transistor, the first p-channel MOS transistor.

In this way, it is possible to reduce the area for making the p-channel MOS transistor, in comparison with the case where the p-channel MOS transistor positioned in the current path between the power supply line and the first node and the p-channel MOS transistor positioned in the current path between the power supply line and the second node are made as separate transistors.

Furthermore, in the semiconductor memory device configured as above, an n-channel MOS transistor positioned in the current path between the power supply line and the gate of the first pull-down n-channel MOS transistor and an n-channel MOS transistor positioned in the current path between the power supply line and the gate of the second pull-down n-channel MOS transistor can be made as the common transistor, the first series connection n-channel MOS transistor. In addition, an n-channel MOS transistor positioned in the current path between the ground line and the gate of the first pull-down n-channel MOS transistor and an n-channel MOS transistor positioned in the current path between the ground line and the gate of the second pull-down n-channel MOS transistor can be made as the common transistor, the second series connection n-channel MOS transistor.

In this way, it is possible to reduce the area for making the n-channel MOS transistor(s), in comparison with the case where the n-channel MOS transistor positioned in the current path between the power supply line and the gate of the first pull-down n-channel MOS transistor and the n-channel MOS transistor positioned in the current path between the power supply line and the gate of the second pull-down n-channel MOS transistor are made as separate transistors, and/or the case where the n-channel MOS transistor positioned in the current path between the ground line and the gate of the first pull-down n-channel MOS transistor and the n-channel MOS transistor positioned in the current path between the ground line and the gate of the second pull-down n-channel MOS transistor are made as separate transistors.

Furthermore, in the semiconductor memory device configured as above, an n-channel MOS transistor positioned in the current path between the power supply line and the gate of the third pull-down n-channel MOS transistor and an n-channel MOS transistor positioned in the current path between the power supply line and the gate of the fourth pull-down n-channel MOS transistor can be made as the common transistor, the third series connection n-channel MOS transistor. In addition, an n-channel MOS transistor positioned in the current path between the ground line and the gate of the third pull-down n-channel MOS transistor and an n-channel MOS transistor positioned in the current path between the ground line and the gate of the fourth pull-down n-channel MOS transistor can be made as the common transistor, the fourth series connection n-channel MOS transistor.

In this way, it is possible to reduce the area for making the n-channel MOS transistor(s), in comparison with the case where the n-channel MOS transistor positioned in the current path between the power supply line and the gate of the third pull-down n-channel MOS transistor and the n-channel MOS transistor positioned in the current path between the power supply line and the gate of the fourth pull-down n-channel MOS transistor are made as separate transistors, and/or the case where the n-channel MOS transistor positioned in the current path between the ground line and the gate of third pull-down n-channel MOS transistor and the n-channel MOS transistor positioned in the current path between the ground line and the gate of the fourth pull-down n-channel MOS transistor are made as separate transistors.

The semiconductor memory device may further include: a second pull-down n-channel MOS transistor that includes: a drain connected to the first word line; a source connected to the ground line; and a gate connected to a second node; a second p-channel MOS transistor that includes: a drain connected to a third node; a source connected to the power supply line; and a gate connected to a second control signal input terminal to which a second control signal is to be input; a third series connection n-channel MOS transistor that includes: a drain connected to the third node; and a source connected to the second node; and a fourth series connection n-channel MOS transistor that includes: a drain connected to the second node; and a source connected to the ground line, in which a signal with the same logic as a signal to be input to the gate of the third series connection n-channel MOS transistor may be input to the gate of the first series connection n-channel MOS transistor, and a signal with the same logic as a signal to be input to the gate of the fourth series connection n-channel MOS transistor may be input to the gate of the second series connection n-channel MOS transistor.

In this way, it is possible to select from among the choices: (1) pulling down the first word line by using the first pull-down n-channel MOS transistor, (2) pulling down the first word line by using the second pull-down n-channel MOS transistor, (3) pulling down the first word line by using the first pull-down n-channel MOS transistor and the second pull-down n-channel MOS transistor, and (4) not pulling down the first word line.

A semiconductor memory device according to another aspect of the present disclosure includes: a first pull-down n-channel metal-oxide-semiconductor (MOS) transistor that includes: a drain connected to a first word line connected to one or more first memory cells; a source connected to a ground line that supplies a ground voltage; and a gate connected to a first node; a first p-channel MOS transistor that includes: a source connected to a power supply line that supplies a power supply voltage; and a drain connected to a second node; a first series connection n-channel MOS transistor that includes: a drain connected to the second node; a source connected to the first node; and a gate connected to a first control signal input terminal to which a first control signal is to be input; and a second series connection n-channel MOS transistor that includes: a drain connected to the first node; and a source connected to the ground line, in which a signal with the same logic as a signal to be input to the gate of the second series connection n-channel MOS transistor is input to the gate of the first p-channel MOS transistor.

In the semiconductor memory device configured as above, the voltage of the first node when the first p-channel MOS transistor is conductive, that is, the gate voltage of the first pull-down n-channel MOS transistor when the first p-channel MOS transistor is conductive is changed to VDD-Vtn.

Generally, Vtn is larger under the low-temperature condition than under the high-temperature condition, and is larger under the condition that the n-channel MOS transistor is slow than under the condition that the n-channel MOS transistor is fast.

Thus, the gate voltage of the first pull-down n-channel MOS transistor is lower when the temperature condition is the low-temperature condition than when the temperature condition is the high-temperature condition, and is lower when the process variation condition is that the n-channel MOS transistor is slow than when the process variation condition is that the n-channel MOS transistor is fast.

In the semiconductor memory device configured as above, the first pull-down n-channel MOS transistor pulls down, according to the gate voltage thereof, the voltage of the first word line in an active state such that the lower the gate voltage, the smaller the pull-down voltage of the first word line in an active state.

Accordingly, in the semiconductor memory device configured as above, the voltage drop of the first word line in an active state is controlled such that the voltage drop of the first word line is smaller when the temperature condition is the low-temperature condition than when the temperature condition is the high-temperature condition and such that the voltage drop of the first word line is smaller when the process variation condition is that the n-channel MOS transistor is slow than when the process variation condition is that the n-channel MOS transistor is fast.

In this way, the semiconductor memory device configured as above is a semiconductor memory device that achieves a voltage drop of a word line to improve the SNM, the voltage drop being such that the read and write capability can be suppressed from decreasing.

Furthermore, by controlling the first control signal, the semiconductor memory device configured as above can perform control as to whether to pull down the voltage of the first word line by using the first pull-down n-channel MOS transistor.

The semiconductor memory device may further include: a second pull-down n-channel MOS transistor that includes: a drain connected to a second word line connected to one or more second memory cells; a source connected to the ground line; and a gate connected to the first node.

In the semiconductor memory device configured as above, the n-channel MOS transistor positioned in the current path between the power supply line and the gate of the first pull-down n-channel MOS transistor and the n-channel MOS transistor positioned in the current path between the power supply line and the gate of the second pull-down n-channel MOS transistor can be made as the common transistor, the first series connection n-channel MOS transistor. In addition, the n-channel MOS transistor positioned in the current path between the ground line and the gate of the first pull-down n-channel MOS transistor and the n-channel MOS transistor positioned in the current path between the ground line and the gate of the second pull-down n-channel MOS transistor can be made as the common transistor, the second series connection n-channel MOS transistor.

Thus, it is possible to increase the size of the first series connection n-channel MOS transistor, in comparison with the case where the n-channel MOS transistor positioned in the current path between the power supply line and the gate of the first pull-down n-channel MOS transistor and the n-channel MOS transistor positioned in the current path between the power supply line and the gate of the second pull-down n-channel MOS transistor are made as separate transistors.

In this way, it is possible to suppress variations in Vtn of the first series connection n-channel MOS transistor.

The semiconductor memory device may further include: a second pull-down n-channel MOS transistor that includes: a drain connected to the first word line; a source connected to the ground line; and a gate connected to the power supply line.

In the semiconductor memory device configured as above, the voltage of the first word line is pulled down by the first pull-down n-channel MOS transistor whose gate voltage is VDD-Vtn and the second pull-down n-channel MOS transistor whose gate voltage is VDD.

In this way, it is possible to control the voltage drop of the first word line more sensitively.

Moreover, the threshold of the first series connection n-channel MOS transistor may be lower than the threshold of the first pull-down n-channel MOS transistor and the threshold of the second series connection n-channel MOS transistor.

In the semiconductor memory device configured as above, when the power supply voltage is set to a low voltage, the gate voltage of the first pull-down n-channel MOS transistor will be lower than the threshold voltage of the first pull-down n-channel MOS transistor. As a result, an occurrence of inconvenience of the first pull-down n-channel MOS transistor not being able to pull down the first word line is suppressed.

Thus, it is possible to expand a low-voltage operation area for the pull-down operation of the first word line.

The semiconductor memory device may further include: a second pull-down n-channel MOS transistor that includes: a drain connected to the first word line; a source connected to the ground line; and a gate connected to a third node; a second p-channel MOS transistor that includes: a source connected to the power supply line; and a drain connected to a fourth node; a third series connection n-channel MOS transistor that includes: a drain connected to the fourth node; a source connected to the third node; and a gate connected to a second control signal input terminal to which a second control signal is to be input; and a fourth series connection n-channel MOS transistor that includes: a drain connected to the third node; and a source connected to the ground line, in which a signal with the same logic as a signal to be input to the gate of the second series connection n-channel MOS transistor may be input to the gate of the second p-channel MOS transistor and the gate of the fourth series connection n-channel MOS transistor.

In this way, it is possible to select from among the choices: (1) pulling down the first word line by using the first pull-down n-channel MOS transistor, (2) pulling down the first word line by using the second pull-down n-channel MOS transistor, (3) pulling down the first word line by using the first pull-down n-channel MOS transistor and the second pull-down n-channel MOS transistor, and (4) not pulling down the first word line.

Hereinafter, specific examples of semiconductor memory devices according to aspects of the present disclosure are described with reference to the figures. Each of the embodiments described herein indicates a specific example of the present disclosure. Accordingly, the numerical values, shapes, constituent elements, arrangement and connection of the constituent elements, as well as steps (processes), orders of the steps, and other details indicated in the following embodiments are merely examples, and do not intend to limit the present disclosure. Moreover, the figures are schematic illustrations and are not necessarily precise depictions. In the figures, substantially the same elements are assigned the same reference signs, and overlapping explanations are omitted or simplified.

Embodiment 1

Hereinafter, a semiconductor memory device according to Embodiment 1 is described. The semiconductor memory device according to Embodiment 1 is SRAM including a word line, and pulls down and decreases the voltage of the word line in an active state to improve the SNM.

<Configuration>

FIG. 1 is a block diagram illustrating a configuration of semiconductor memory device 1 according to Embodiment 1.

As illustrated in FIG. 1, semiconductor memory device 1 includes memory cell array 50, row decoder 60, I/O circuit 70, controller 80, a plurality of word lines 20, and a plurality of assist circuits 10.

Memory cell array 50 includes a plurality of memory cells 40 arranged in a matrix.

The plurality of memory cells 40 constituting memory cell array 50 are connected, for each row, to common word line 20. That is, semiconductor memory device 1 includes word lines 20 equal in number to the number of rows of memory cell array 50.

Memory cell array 50 further includes, for each column, a set of bit line 28 and inverted bit line 29. Then, the plurality of memory cells 40 constituting memory cell array 50 are connected, for each column, to a common set of bit line 28 and inverted bit line 29. That is, memory cell array 50 includes sets of bit line 28 and inverted bit line 29 equal in number to the number of columns of memory cell array 50.

Figure 2:
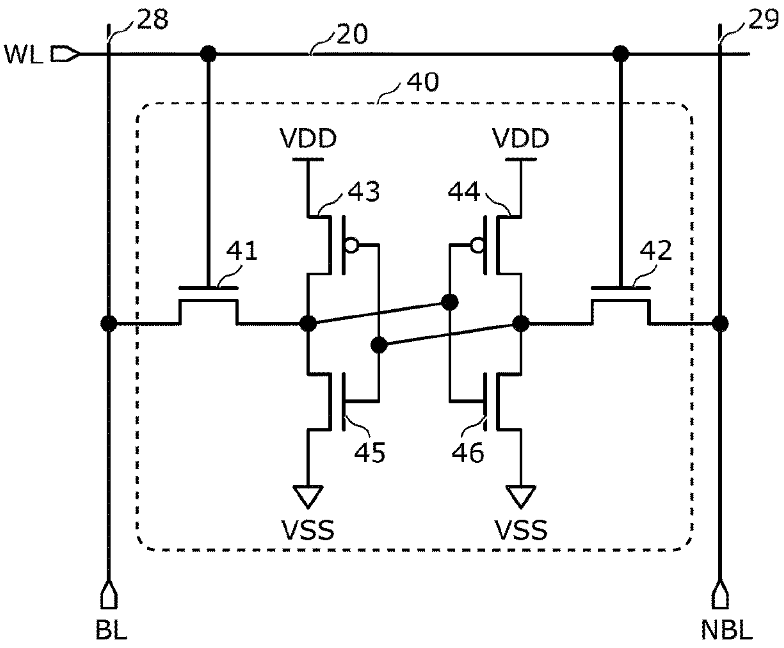
FIG. 2 is a circuit diagram illustrating a configuration of a memory cell according to Embodiment 1.

FIG. 2 is a circuit diagram illustrating a configuration of memory cell 40.

As illustrated in FIG. 2, memory cell 40 is connected to word line 20, bit line 28, and inverted bit line 29. Memory cell includes the following six transistors: access transistor 41, access transistor 42, load transistor 43, load transistor 44, drive transistor 45, and drive transistor 46. Access transistor 41, access transistor 42, drive transistor 45, and drive transistor 46 are n-channel MOS transistors. Load transistor 43 and load transistor 44 are p-channel MOS transistors.

We will return to FIG. 1 and continue to describe semiconductor memory device 1.

Each of the plurality of word lines 20 is connected to one or more memory cells 40 constituting one row of memory cell array 50.

Row decoder 60 selects a row of memory cell array 50. More specifically, row decoder 60 includes a plurality of word line drivers 30 that drive the plurality of word lines 20 in a one-to-one manner. One of the plurality of word line drivers 30 drives one of the plurality of word lines 20 and turns the word line into an active state, thereby selecting the row made up of one or more memory cells 40 connected to one word line 20 turned into an active state.

I/O circuit 70 writes data to memory cell array 50 and reads out data held by memory cell array 50.

Controller 80 controls memory cell array 50, row decoder 60, I/O circuit 70, and the plurality of assist circuits 10.

Assist circuit 10 pulls down and decreases the voltage of word line 20 in an active state.

The plurality of assist circuits 10 are connected to the plurality of word lines 20 in a one-to-one correspondence. That is, semiconductor memory device 1 includes assist circuits 10 equal in number to the number of word lines 20.

Figure 3:
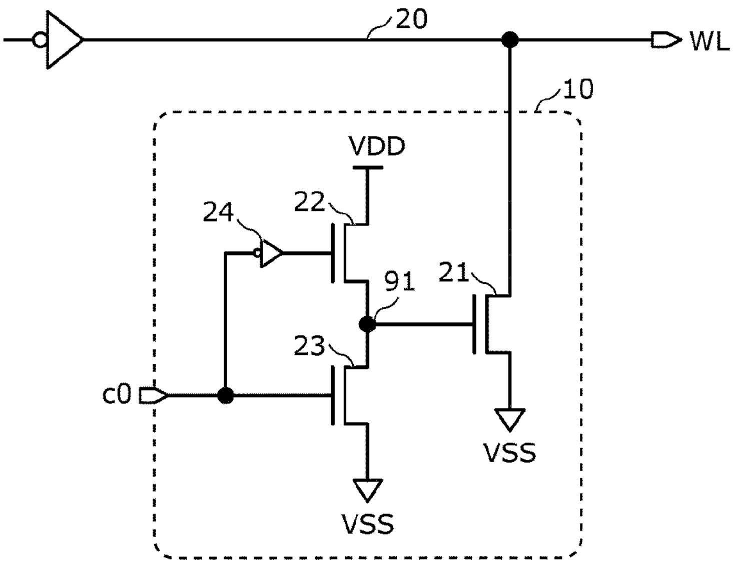
FIG. 3 is a circuit diagram illustrating a configuration of an assist circuit according to Embodiment 1.

FIG. 3 is a circuit diagram illustrating a configuration of assist circuit 10.

As illustrated in FIG. 3, assist circuit 10 includes first pull-down n-channel MOS transistor 21, first series connection n-channel MOS transistor 22, and second series connection n-channel MOS transistor 23. The drain, source, and gate of first pull-down n-channel MOS transistor 21 are respectively connected to word line 20, a ground line that supplies a ground voltage (VSS), and first node 91. The drain and source of first series connection n-channel MOS transistor 22 are respectively connected to a power supply line that supplies a power supply voltage (VDD) and first node 91. The drain and source of second series connection n-channel MOS transistor 23 are respectively connected to first node 91 and the ground line.

Assist circuit 10 further includes inverter 24 connected in order to input, to the gate of first series connection n-channel MOS transistor 22, the inverse-logic signal of a signal to be input to the gate of second series connection n-channel MOS transistor 23.

<Observations>

Figure 4:
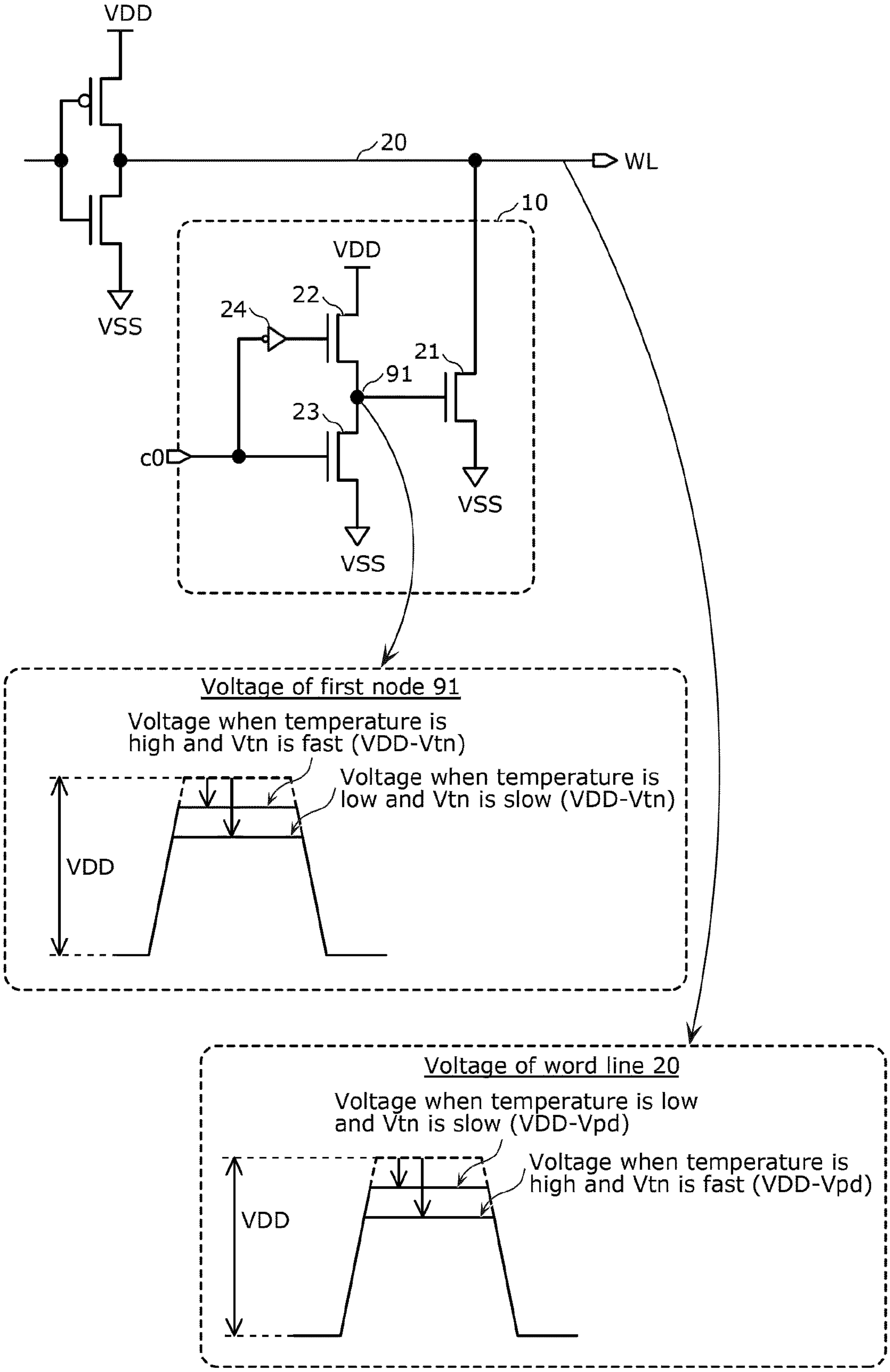
FIG. 4 is a schematic diagram illustrating a situation in which the assist circuit according to Embodiment 1 pulls down and decreases the voltage of a word line in an active state.

FIG. 4 is a schematic diagram illustrating a situation in which assist circuit 10 pulls down and decreases the voltage of word line 20 in an active state.

In assist circuit 10, when a logic value of 0 is input to terminal c0, that is, when the voltage of terminal c0 is changed to the VSS, first series connection n-channel MOS transistor 22 becomes conductive, and second series connection n-channel MOS transistor 23 becomes non-conductive.

In this way, the voltage of first node 91, that is, the gate voltage of first pull-down n-channel MOS transistor 21 is changed to VDD-Vtn.

Generally, Vtn is larger under the low-temperature condition than under the high-temperature condition, and is larger under the condition that the n-channel MOS transistor is slow than under the condition that the n-channel MOS transistor is fast.

Thus, as illustrated in FIG. 4, voltage VDD-Vtn of first node 91, that is, gate voltage VDD-Vtn of first pull-down n-channel MOS transistor 21 is lower when the temperature condition is the low-temperature condition than when the temperature condition is the high-temperature condition, and is lower when the process variation condition is that the n-channel MOS transistor is slow than when the process variation condition is that the n-channel MOS transistor is fast.

In assist circuit 10, first pull-down n-channel MOS transistor 21 pulls down, according to the gate voltage thereof, the voltage of word line 20 in an active state such that the lower the gate voltage, the smaller pull-down voltage Vpd of word line 20 in an active state.

Accordingly, as illustrated in FIG. 4, in semiconductor memory device 1, the voltage drop of word line 20 in an active state is controlled such that voltage drop Vpd of word line 20 is smaller when the temperature condition is the low-temperature condition than when the temperature condition is the high-temperature condition and such that voltage drop Vpd of word line 20 is smaller when the process variation condition is that the n-channel MOS transistor is slow than when the process variation condition is that the n-channel MOS transistor is fast.

In this way, semiconductor memory device 1 configured as above can achieve a voltage drop of a word line to improve the SNM, the voltage drop being such that the read and write capability can be suppressed from decreasing.

Embodiment 2

Hereinafter, a semiconductor memory device according to Embodiment 2 is described which is configured by changing a part of the configuration of semiconductor memory device 1 according to Embodiment 1.

Here, constituent elements in the semiconductor memory device according to Embodiment 2 that are similar to those of semiconductor memory device 1 are assigned the same reference signs as those already described, and detailed descriptions thereof will be omitted, with the descriptions focusing on the differences from semiconductor memory device 1.

<Configuration>

Figure 5:
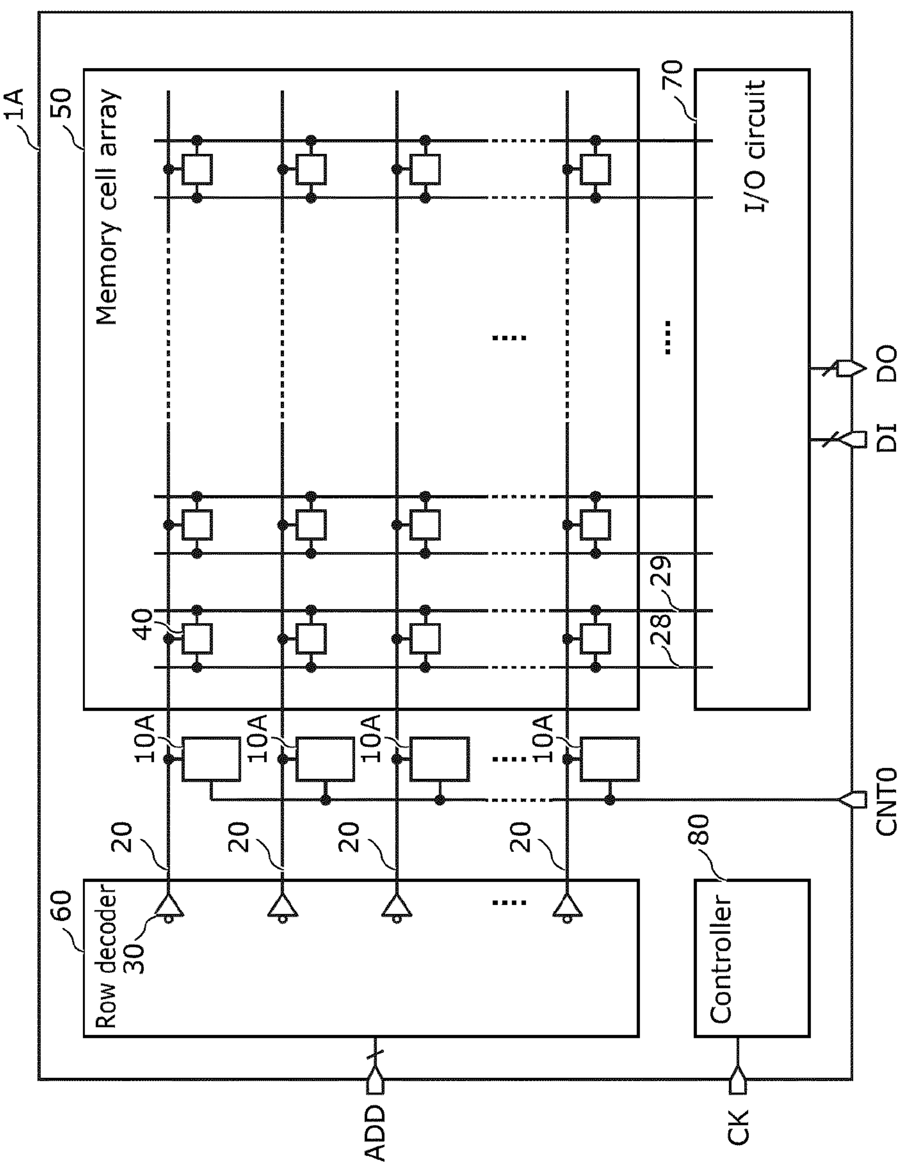
FIG. 5 is a block diagram illustrating a configuration of a semiconductor memory device according to Embodiment 2.

FIG. 5 is a block diagram illustrating a configuration of semiconductor memory device 1A according to Embodiment 2.

As illustrated in FIG. 5, semiconductor memory device 1A is configured by adding first control signal input terminal CNT0 to semiconductor memory device 1 according to Embodiment 1 and replacing assist circuit 10 in semiconductor memory device 1 with assist circuit 10A.

First control signal input terminal CNT0 is a terminal to which a first control signal is to be input from outside of semiconductor memory device 1A. First control signal input terminal CNT0 is connected to all the gates of first p-channel MOS transistors 25 (see FIG. 6 described later) included in a plurality of assist circuits 10A and described later.

Figure 6:
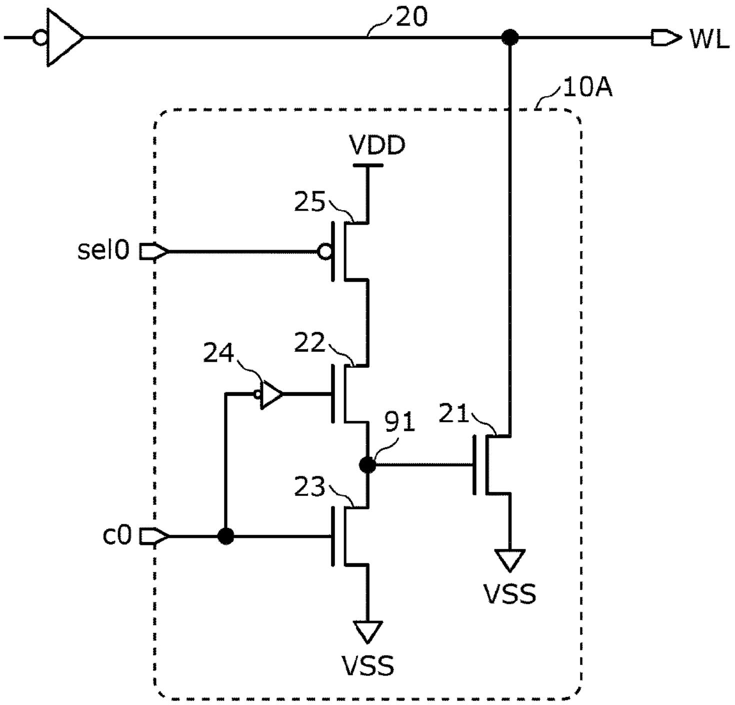
FIG. 6 is a circuit diagram illustrating a configuration of an assist circuit according to Embodiment 2.

FIG. 6 is a circuit diagram illustrating a configuration of assist circuit 10A.

As illustrated in FIG. 6, assist circuit 10A is configured by adding, to assist circuit 10 according to according to Embodiment 1, first p-channel MOS transistor 25 between a power supply line and the drain of first series connection n-channel MOS transistor 22. More specifically, assist circuit 10A is configured by adding first p-channel MOS transistor 25 whose drain is connected to the drain of first series connection n-channel MOS transistor 22 and whose source is connected to the power supply line.

Moreover, the gate of first p-channel MOS transistor 25 is connected to first control signal input terminal CNT0 via terminal sel0.

<Observations>

In assist circuit 10A configured as above, the drain of first series connection n-channel MOS transistor 22 is connected to the power supply line via first p-channel MOS transistor 25.

Thus, when a first control signal with a logic value of 0 has been input by first control signal input terminal CNT0, that is, when the voltage of terminal sel0 is VSS, first p-channel MOS transistor 25 becomes conductive. As such, as with assist circuit 10 according to Embodiment 1, in assist circuit 10A, when a logic value of 0 is input to terminal c0, that is, the voltage of terminal c0 is changed to VSS, first series connection n-channel MOS transistor 22 becomes conductive, and second series connection n-channel MOS transistor 23 becomes non-conductive.

In this way, the voltage of first node 91, that is, the gate voltage of first pull-down n-channel MOS transistor 21 is changed to VDD-Vtn.

Meanwhile, when the first control signal with a logic value of 1 has been input by first control signal input terminal CNT0, that is, when the voltage of terminal sel0 is VDD, first p-channel MOS transistor 25 becomes non-conductive.

Thus, in assist circuit 10A, once a logic value of 1 is input to terminal c0, that is, once the voltage of terminal c0 is changed to VDD, second series connection n-channel MOS transistor 23 becomes conductive, and the voltage of first node 91 is reset (changed to VSS). After that, the voltage of first node 91 will not be higher than VSS, that is, first pull-down n-channel MOS transistor 21 will not pull down the voltage of word line 20 in an active state to decrease the voltage.

As such, by controlling the first control signal, semiconductor memory device 1A configured as above can perform control as to whether to enable the function of decreasing the voltage of word line 20 in an active state (hereinafter, also referred to as an assist function).

This enables a user of semiconductor memory device 1A to evaluate the characteristics of memory cell 40 in a state in which the assist function is not enabled.

Moreover, this can make the user of semiconductor memory device 1A not enable the assist function when using semiconductor memory device 1A in a state of having relatively high read and write capability, such as when semiconductor memory device 1A is used with a relatively high power supply voltage.

Moreover, this makes it possible to relatively readily perform power supply cutoff control to suppress a leakage current.

Embodiment 3

Hereinafter, a semiconductor memory device according to Embodiment 3 is described which is configured by changing a part of the configuration of semiconductor memory device 1A according to Embodiment 2.

Here, constituent elements in the semiconductor memory device according to Embodiment 3 that are similar to those of semiconductor memory device 1A are assigned the same reference signs as those already described, and detailed descriptions thereof will be omitted, with the descriptions focusing on the differences from semiconductor memory device 1A.

<Configuration>

Figure 7:
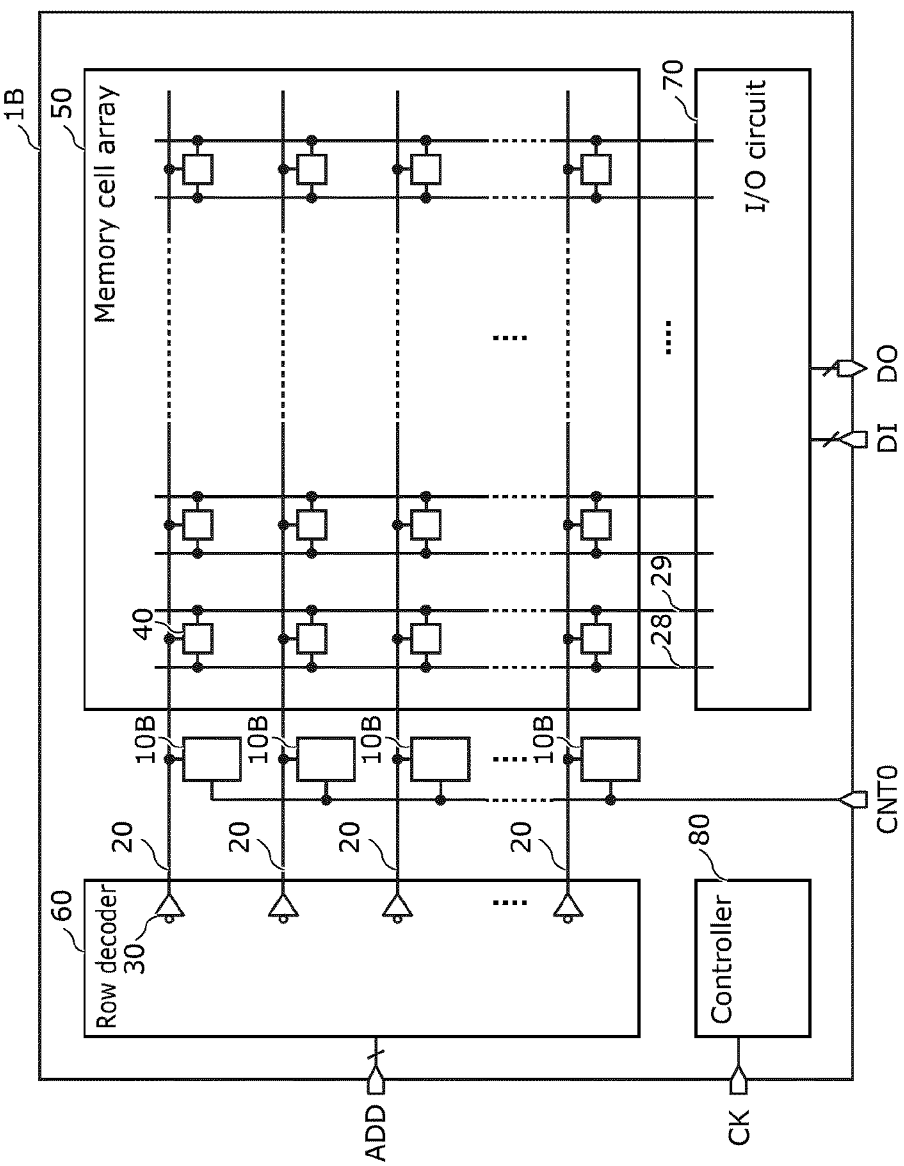
FIG. 7 is a block diagram illustrating a configuration of a semiconductor memory device according to Embodiment 3.

FIG. 7 is a block diagram illustrating a configuration of semiconductor memory device 1B according to Embodiment 3.

As illustrated in FIG. 7, semiconductor memory device 1B is configured by replacing assist circuit 10A in semiconductor memory device 1A according to Embodiment 2 with assist circuit 10B.

Here, first control signal input terminal CNT0 is connected to all the gates of first series connection n-channel MOS transistor 22B (see FIG. 8 described later) included in a plurality of assist circuits 10B and described later.

Figure 8:
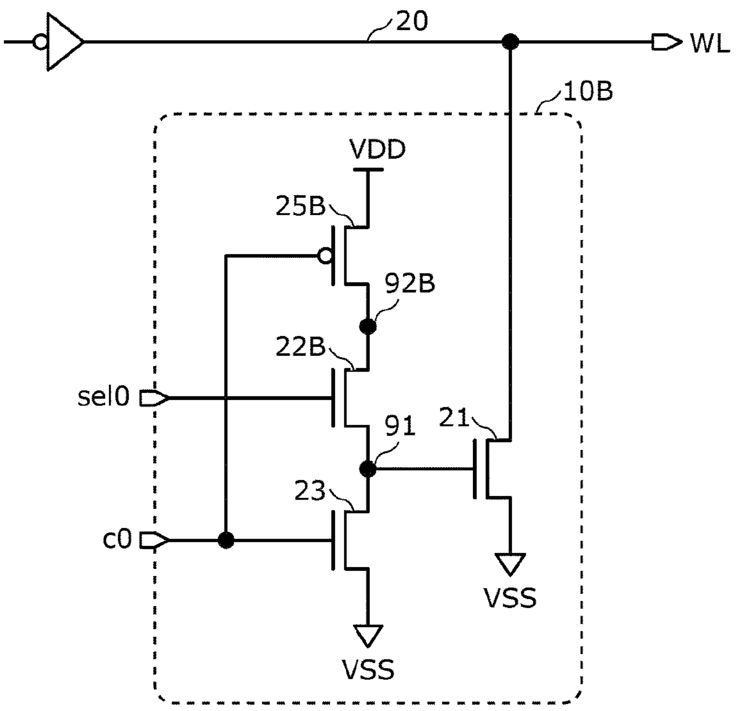
FIG. 8 is a circuit diagram illustrating a configuration of an assist circuit according to Embodiment 3.

FIG. 8 is a circuit diagram illustrating a configuration of assist circuit 10B.

As illustrated in FIG. 8, assist circuit 10B is configured by making the following changes to assist circuit 10 according to Embodiment 1: inverter 24 has been removed, first series connection n-channel MOS transistor 22 has been replaced with first series connection n-channel MOS transistor 22B, and first p-channel MOS transistors 25 has been replaced with first p-channel MOS transistor 25B.

A signal with the same logic (here, the same signal) as a signal to be input to the gate of second series connection n-channel MOS transistor 23 is input to the gate of first series connection n-channel MOS transistor 22B.

Moreover, the gate of first series connection n-channel MOS transistor 22B is connected to first control signal input terminal CNT0 via terminal sel0.

<Observations>

In assist circuit 10B configured as above, the drain of first series connection n-channel MOS transistor 22B (that is, second node 92B) is connected to a power supply line via first p-channel MOS transistor 25B.

Thus, when a first control signal with a logic value of 1 has been input by first control signal input terminal CNT0, that is, when the voltage of terminal sel0 is VDD, first series connection n-channel MOS transistor 22B becomes conductive. As such, in assist circuit 10B, when a logic value of 0 is input to terminal c0, that is, the voltage of terminal c0 is changed to VSS, first p-channel MOS transistor 25B becomes conductive, and second series connection n-channel MOS transistor 23 becomes non-conductive.

In this way, the voltage of first node 91, that is, the gate voltage of first pull-down n-channel MOS transistor 21 is changed to VDD-Vtn.

Meanwhile, when the first control signal with a logic value of 0 has been input by first control signal input terminal CNT0, that is, when the voltage of terminal sel0 is VSS, first series connection n-channel MOS transistor 22B becomes non-conductive.

Thus, in assist circuit 10B, once a logic value of 1 is input to terminal c0, that is, once the voltage of terminal c0 is changed to VDD, second series connection n-channel MOS transistor 23 becomes conductive, and the voltage of first node 91 is reset (changed to VSS). After that, the voltage of first node 91 will not be higher than VSS, that is, first pull-down n-channel MOS transistor 21 will not pull down the voltage of word line 20 in an active state to decrease the voltage.

As such, as with semiconductor memory device 1A according to Embodiment 2, semiconductor memory device 1B configured as above can perform control as to whether to enable the assist function, by controlling the first control signal.

Embodiment 4

Hereinafter, a semiconductor memory device according to Embodiment 4 is described which is configured by changing a part of the configuration of semiconductor memory device 1A according to Embodiment 2.

Here, constituent elements in the semiconductor memory device according to Embodiment 4 that are similar to those of semiconductor memory device 1A are assigned the same reference signs as those already described, and detailed descriptions thereof will be omitted, with the descriptions focusing on the differences from semiconductor memory device 1A.

<Configuration>

Figure 9:
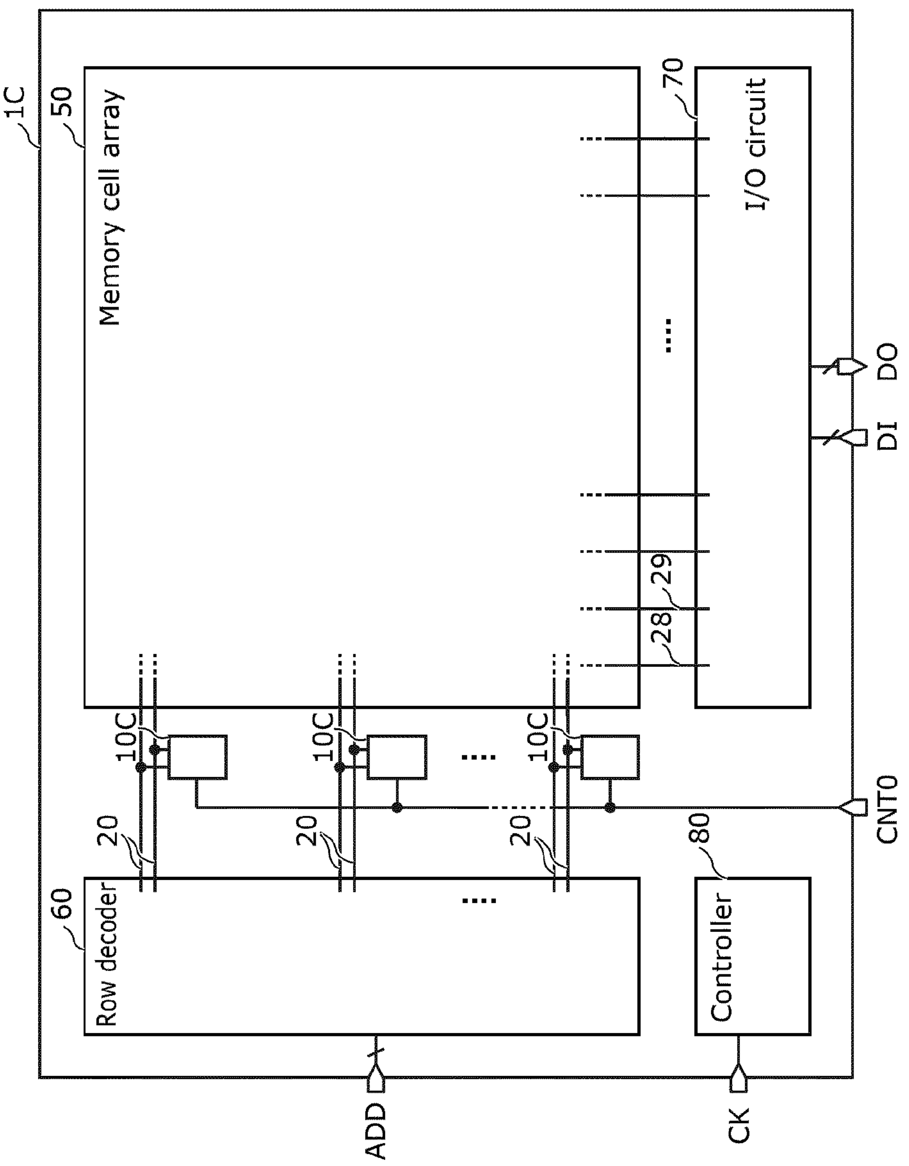
FIG. 9 is a block diagram illustrating a configuration of a semiconductor memory device according to Embodiment 4.

FIG. 9 is a block diagram illustrating a configuration of semiconductor memory device 1C according to Embodiment 4.

As illustrated in FIG. 9, semiconductor memory device 1C is configured by replacing two assist circuits 10A in semiconductor memory device 1A according to Embodiment 2 with one assist circuit 10C.

That is, each of a plurality of assist circuits 10C is connected to two word lines 20. Thus, semiconductor memory device 1C includes assist circuits 10C whose number is half the number of word lines 20.

Here, first control signal input terminal CNT0 is connected to all the gates of first p-channel MOS transistors 25 (see FIG. 10 described later) included in a plurality of assist circuits 10C.

Figure 10:
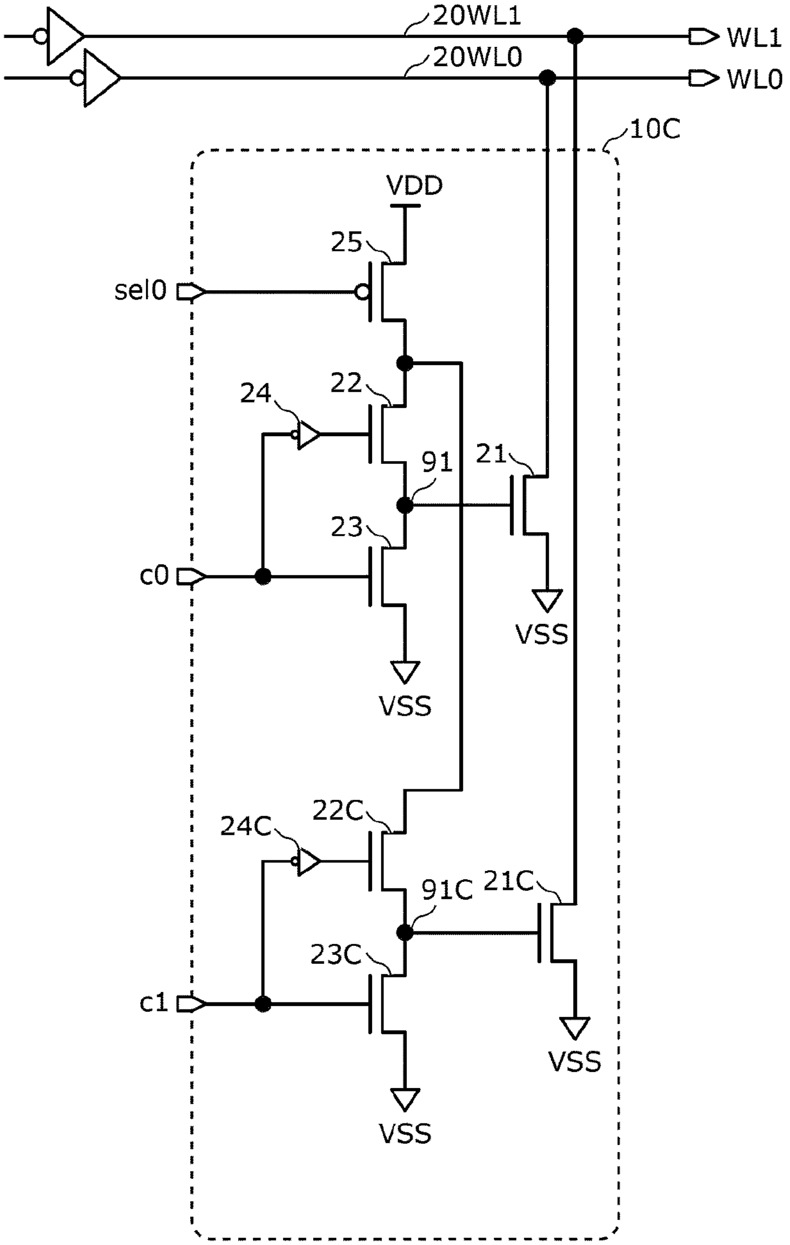
FIG. 10 is a circuit diagram illustrating a configuration of an assist circuit according to Embodiment 4.

FIG. 10 is a circuit diagram illustrating a configuration of assist circuit 10C. Here, one of two word lines 20 connected to assist circuit 10C is referred to as word line 20WL0, and the other is referred to as word line 20WL1. That is, among two word lines 20 connected to assist circuit 10C, word line 20 connected to one or more memory cells 40 that form a given row (for example, the zero-th row) of memory cell array 50 is referred to as word line 20WL0, and word line 20 connected to one or more memory cells 40 that form another row (for example, the first row) of memory cell array 50 is referred to as word line 20WL1.

As illustrated in FIG. 10, assist circuit 10C is configured by adding, to assist circuit 10A according to Embodiment 2, second pull-down n-channel MOS transistor 21C, third series connection n-channel MOS transistor 22C, and fourth series connection n-channel MOS transistor 23C. Here, the drain, source, and gate of second pull-down n-channel MOS transistor 21C are respectively connected to word line 20 (here, word line 20WL1), a ground line, and second node 91C. The drain and source of third series connection n-channel MOS transistor 22C are respectively connected to the drain of first p-channel MOS transistors 25 and second node 91C. The drain and source of fourth series connection n-channel MOS transistor 23C are respectively connected to second node 91C and the ground line.

Assist circuit 10C is configured by further adding, to assist circuit 10A, inverter 24C connected in order to input, to the gate of third series connection n-channel MOS transistor 22C, the inverse-logic signal of a signal to be input to the gate of fourth series connection n-channel MOS transistor 23C.

<Observations>

In assist circuit 10C configured as above, the drain of third series connection n-channel MOS transistor 22C is connected to a power supply line via first p-channel MOS transistors 25.

Thus, when a first control signal with a logic value of 0 has been input by first control signal input terminal CNT0, that is, when the voltage of terminal sel0 is VSS, first p-channel MOS transistor 25 becomes conductive. As such, in assist circuit 10C, when a logic value of 0 is input to terminal c1, that is, the voltage of terminal c1 is changed to VSS, third series connection n-channel MOS transistor 22C becomes conductive, and fourth series connection n-channel MOS transistor 23C becomes non-conductive.

In this way, the voltage of second node 91C, that is, the gate voltage of second pull-down n-channel MOS transistor 21C is changed to VDD-Vtn.

Meanwhile, when the first control signal with a logic value of 1 has been input by first control signal input terminal CNT0, that is, when the voltage of terminal sel0 is VDD, first p-channel MOS transistor 25 becomes non-conductive.

Thus, in assist circuit 10C, once a logic value of 1 is input to terminal c1, that is, once the voltage of terminal c1 is changed to VDD, fourth series connection n-channel MOS transistor 23C becomes conductive, and the voltage of second node 91C is reset (changed to VSS). After that, the voltage of second node 91C will not be higher than VSS, that is, second pull-down n-channel MOS transistor 21C will not pull down the voltage of word line 20WL1 in an active state to decrease the voltage.

As such, by controlling the first control signal, semiconductor memory device 1C configured as above can perform control as to whether to enable the assist function of word line 20 in an active state.

In assist circuit 10C configured as above, a p-channel MOS transistor positioned in the current path between the power supply line and first node 91 and a p-channel MOS transistor positioned in the current path between the power supply line and second node 91C can made as the common transistor, first p-channel MOS transistor 25.

In this way, it is possible to reduce the area for making the p-channel MOS transistor, in comparison with the case where the p-channel MOS transistor positioned in the current path between the power supply line and first node 91 and the p-channel MOS transistor positioned in the current path between the power supply line and second node 91C are made as separate transistors.

It should be noted that according to the descriptions in Embodiment 4, assist circuit 10C is configured by, for example, adding, to assist circuit 10A according to Embodiment 2, another circuit group of second pull-down n-channel MOS transistor 21C, third series connection n-channel MOS transistor 22C, fourth series connection n-channel MOS transistor 23C, and inverter 24C, and can perform control as to whether to enable the assist functions of two word lines 20 (word line 20WL0 and word line 20WL1) in an active state.

By contrast, as another configuration example, assist circuit 10C may be configured by adding, to assist circuit 10A according to Embodiment 2, N circuit groups each of which is the above-mentioned circuit group (where N is an integer greater than or equal to two), and assist circuit 10C may be able to perform control as to whether to enable the assist functions of at least N+1 word lines 20 in an active state.

In this case, semiconductor memory device 1C includes assist circuits 10C whose number is one/(N+1)th the number of word lines 20.

Embodiment 5

Hereinafter, a semiconductor memory device according to Embodiment 5 is described which is configured by changing a part of the configuration of semiconductor memory device 1A according to Embodiment 2.

Here, constituent elements in the semiconductor memory device according to Embodiment 5 that are similar to those of semiconductor memory device 1A are assigned the same reference signs as those already described, and detailed descriptions thereof will be omitted, with the descriptions focusing on the differences from semiconductor memory device 1A.

<Configuration>

Figure 11:
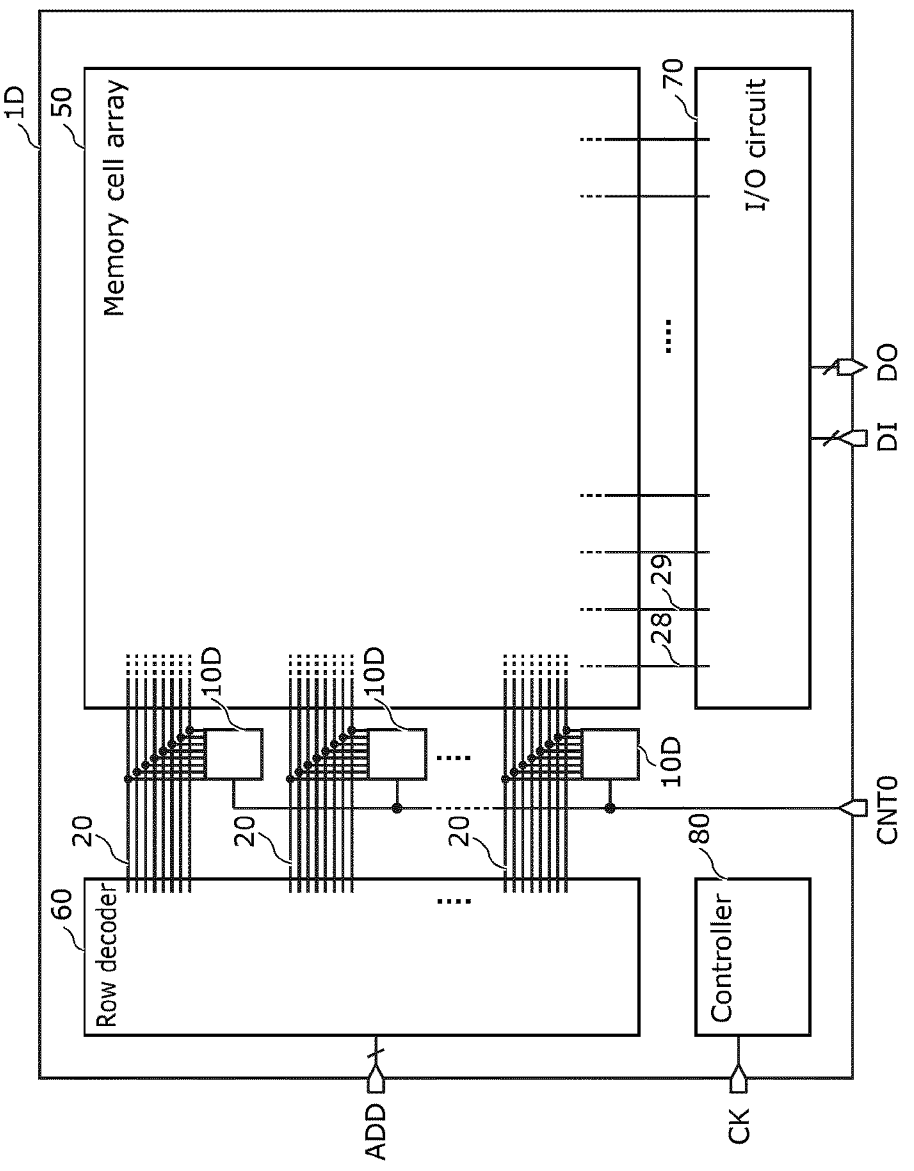
FIG. 11 is a block diagram illustrating a configuration of a semiconductor memory device according to Embodiment 5.

FIG. 11 is a block diagram illustrating a configuration of semiconductor memory device 1D according to Embodiment 5.

As illustrated in FIG. 11, semiconductor memory device 1D is configured by replacing eight assist circuits 10A in semiconductor memory device 1A according to Embodiment 2 with one assist circuit 10D.

That is, each of a plurality of assist circuits 10D is connected to eight word lines 20. Thus, semiconductor memory device 1D includes assist circuits 10D whose number is one-eighth the number of word lines 20.

Here, first control signal input terminal CNT0 is connected to all the gates of first p-channel MOS transistors 25 (see FIG. 12 described later) included in the plurality of assist circuits 10D.

Figure 12:
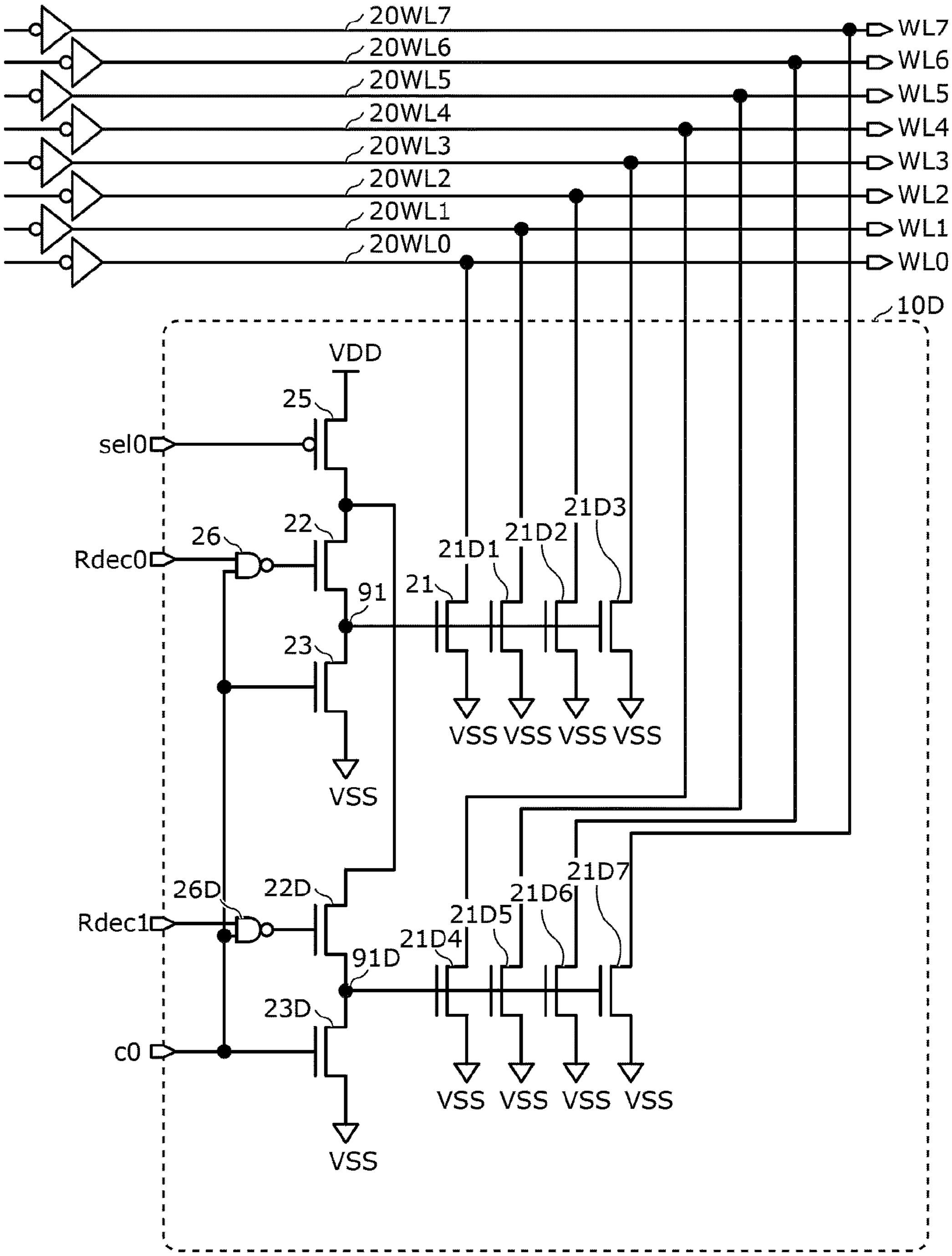
FIG. 12 is a circuit diagram illustrating a configuration of an assist circuit according to Embodiment 5.

FIG. 12 is a circuit diagram illustrating a configuration of assist circuit 10D. Here, eight word lines 20 connected to assist circuit 10D are referred to as word line 20WL0, word line 20WL1, word line 20WL2, word line 20WL3, word line 20WL4, word line 20WL5, word line 20WL6, and word line 20WL7. That is, among eight word lines 20 connected to assist circuit 10D, word line 20 connected to one or more memory cells 40 that form a given row (for example, the zero-th row) of memory cell array 50 is referred to as word line 20WL0, word line 20 connected to one or more memory cells 40 that form another row (for example, the first row) of memory cell array 50 is referred to as word line 20WL1, word line 20 connected to one or more memory cells 40 that form yet another row (for example, the second row) of memory cell array 50 is referred to as word line 20WL2, word line 20 connected to one or more memory cells 40 that form yet another row (for example, the third row) of memory cell array 50 is referred to as word line 20WL3, word line 20 connected to one or more memory cells 40 that form yet another row (for example, the fourth row) of memory cell array 50 is referred to as word line 20WL4, word line 20 connected to one or more memory cells 40 that form yet another row (for example, the fifth row) of memory cell array 50 is referred to as word line 20WL5, word line 20 connected to one or more memory cells 40 that form yet another row (for example, the sixth row) of memory cell array 50 is referred to as word line 20WL6, and word line 20 connected to one or more memory cells 40 that form yet another row (for example, the seventh row) of memory cell array 50 is referred to as word line 20WL7.

As illustrated in FIG. 12, assist circuit 10D is configured by adding, to assist circuit 10A according to Embodiment 2, second pull-down n-channel MOS transistor 21D1, third pull-down n-channel MOS transistor 21D2, fourth pull-down n-channel MOS transistor 21D3, fifth pull-down n-channel MOS transistor 21D4, sixth pull-down n-channel MOS transistor 21D5, seventh pull-down n-channel MOS transistor 21D6, eighth pull-down n-channel MOS transistor 21D7, third series connection n-channel MOS transistor 22D, and fourth series connection n-channel MOS transistor 23D. The drain, source, and gate of second pull-down n-channel MOS transistor 21D1 are respectively connected to word line 20 (here, word line 20WL1), a ground line, and first node 91. The drain, source, and gate of third pull-down n-channel MOS transistor 21D2 are respectively connected to word line 20 (here, word line 20WL2), the ground line, and first node 91. The drain, source, and gate of fourth pull-down n-channel MOS transistor 21D3 are respectively connected to word line 20 (here, word line 20WL3), the ground line, and first node 91. The drain, source, and gate of fifth pull-down n-channel MOS transistor 21D4 are respectively connected to word line 20 (here, word line 20WL4), the ground line, and second node 91D. The drain, source, and gate of sixth pull-down n-channel MOS transistor 21D5 are respectively connected to word line 20 (here, word line 20WL5), the ground line, and second node 91D. The drain, source, and gate of seventh pull-down n-channel MOS transistor 21D6 are respectively connected to word line 20 (here, word line 20WL6), the ground line, and second node 91D. The drain, source, and gate of eighth pull-down n-channel MOS transistor 21D7 are respectively connected to word line 20 (here, word line 20WL7), the ground line, and second node 91D. The drain and source of third series connection n-channel MOS transistor 22D are respectively connected to the drain of first p-channel MOS transistors 25 and second node 91D. The drain and source of fourth series connection n-channel MOS transistor 23D are respectively connected to second node 91D and the ground line.

Assist circuit 10D is configured by further making the following changes to assist circuit 10A: inverter 24 has been removed, and NAND circuit 26 and NAND circuit 26D have been added. NAND circuit 26 is connected in order to input, to the gate of first series connection n-channel MOS transistor 22, the inverse-logic signal of a signal to be input to the gate of second series connection n-channel MOS transistor 23 when word line 20WL0, word line 20WL1, word line 20WL2, and/or word line WL3 is active (here, when signal with a logic value of 1 is input to terminal Rdec0). NAND circuit 26D is connected in order to input, to the gate of third series connection n-channel MOS transistor 22D, the inverse-logic signal of a signal to be input to the gate of fourth series connection n-channel MOS transistor 23D when word line 20WL4, word line 20WL5, word line 20WL6, and/or word line WL7 is active (here, when a signal with a logic value of 1 is input to terminal Rdec1).

<Observations>

In assist circuit 10D configured as above, the drain of first series connection n-channel MOS transistor 22 is connected to a power supply line via first p-channel MOS transistor 25.

Thus, in a state where a signal with a logic value of 0 has been input by terminal Rdec0, that is, in a state where the voltage of terminal Rdec0 is VSS, when a first control signal with a logic value of 0 is input by first control signal input terminal CNT0, that is, when the voltage of terminal sel0 is VSS, first p-channel MOS transistor 25 becomes conductive. As such, in assist circuit 10D, when a logic value of 0 is input to terminal c0, that is, when the voltage of terminal c0 is changed to VSS, first series connection n-channel MOS transistor 22 becomes conductive, and second series connection n-channel MOS transistor 23 becomes non-conductive.

In this way, the voltage of first node 91, that is, the gate voltages of first pull-down n-channel MOS transistor 21, second pull-down n-channel MOS transistor 21D1, third pull-down n-channel MOS transistor 21D2, and fourth pull-down n-channel MOS transistor 21D3 are changed to VDD-Vtn.

Meanwhile, when the first control signal with a logic value of 1 has been input by first control signal input terminal CNT0, that is, when the voltage of terminal sel0 is VDD, first p-channel MOS transistor 25 becomes non-conductive.

Thus, in assist circuit 10D, once a logic value of 1 is input to terminal c0, that is, once the voltage of terminal c0 is changed to VDD, second series connection n-channel MOS transistor 23 becomes conductive, and the voltage of first node 91 is reset (changed to VSS). After that, the voltage of first node 91 will not be higher than VSS, that is, each of first pull-down n-channel MOS transistor 21, second pull-down n-channel MOS transistor 21D1, third pull-down n-channel MOS transistor 21D2, and fourth pull-down n-channel MOS transistor 21D3 will not pull down the voltage of a corresponding one of word line 20WL0, word line 20WL1, word line 20WL2, and word line 20WL3 in an active state to decrease the voltage.

Moreover, in a state where a signal with a logic value of 0 has been input by terminal Rdec1, that is, in a state where the voltage of terminal Rdec1 is VSS, when the first control signal with a logic value of 0 is input by first control signal input terminal CNT0, that is, when the voltage of terminal sel0 is VSS, first p-channel MOS transistor 25 becomes conductive. As such, in assist circuit 10D, when a logic value of 0 is input to terminal c0, that is, when the voltage of terminal c0 is changed to VSS, third series connection n-channel MOS transistor 22D becomes conductive, and fourth series connection n-channel MOS transistor 23D becomes non-conductive.

In this way, the voltage of second node 91D, that is, the gate voltages of fifth pull-down n-channel MOS transistor 21D4, sixth pull-down n-channel MOS transistor 21D5, seventh pull-down n-channel MOS transistor 21D6, and eighth pull-down n-channel MOS transistor 21D7 are changed to VDD-Vtn.

Meanwhile, when the first control signal with a logic value of 1 has been input by first control signal input terminal CNT0, that is, when the voltage of terminal sel0 is VDD, first p-channel MOS transistor 25 becomes non-conductive.

Thus, in assist circuit 10D, once a logic value of 1 is input to terminal c0, that is, once the voltage of terminal c0 is changed to VDD, fourth series connection n-channel MOS transistor 23D becomes conductive, and the voltage of second node 91D is reset (changed to VSS). After that, the voltage of second node 91D will not be higher than VSS, that is, each of fifth pull-down n-channel MOS transistor 21D4, sixth pull-down n-channel MOS transistor 21D5, seventh pull-down n-channel MOS transistor 21D6, and eighth pull-down n-channel MOS transistor 21D7 will not pull down the voltage of a corresponding one of word line 20WL4, word line 20WL5, word line 20WL6, and word line 20WL7 in an active state to decrease the voltage.

As such, by controlling the first control signal, semiconductor memory device 1D configured as above can perform control as to whether to enable the assist function of word line 20 in an active state.

In assist circuit 10D configured as above, a p-channel MOS transistor positioned in the current path between the power supply line and first node 91 and a p-channel MOS transistor positioned in the current path between the power supply line and second node 91D can made as the common transistor, first p-channel MOS transistor 25.

In this way, it is possible to reduce the area for making the p-channel MOS transistor, in comparison with the case where the p-channel MOS transistor positioned in the current path between the power supply line and first node 91 and the p-channel MOS transistor positioned in the current path between the power supply line and second node 91D are made as separate transistors.

Furthermore, in assist circuit 10D configured as above, an n-channel MOS transistor positioned in the current path between the power supply line and the gate of first pull-down n-channel MOS transistor 21, an n-channel MOS transistor positioned in the current path between the power supply line and the gate of second pull-down n-channel MOS transistor 21D1, an n-channel MOS transistor positioned in the current path between the power supply line and the gate of third pull-down n-channel MOS transistor 21D2, and an n-channel MOS transistor positioned in the current path between the power supply line and the gate of fourth pull-down n-channel MOS transistor 21D3 can be made as the common transistor, first series connection n-channel MOS transistor 22. In addition, an n-channel MOS transistor positioned in the current path between ground line and the gate of first pull-down n-channel MOS transistor 21, an n-channel MOS transistor positioned in the current path between the ground line and the gate of second pull-down n-channel MOS transistor 21D1, an n-channel MOS transistor positioned in the current path between the ground line and the gate of third pull-down n-channel MOS transistor 21D2, and an n-channel MOS transistor positioned in the current path between the ground line and the gate of fourth pull-down n-channel MOS transistor 21D3 can be made as the common transistor, second series connection n-channel MOS transistor 23.

In this way, it is possible to reduce the area for making the n-channel MOS transistor(s), in comparison with the case where the n-channel MOS transistor positioned in the current path between the power supply line and the gate of first pull-down n-channel MOS transistor 21, the n-channel MOS transistor positioned in the current path between the power supply line and the gate of second pull-down n-channel MOS transistor 21D1, the n-channel MOS transistor positioned in the current path between the power supply line and the gate of third pull-down n-channel MOS transistor 21D2, and the n-channel MOS transistor positioned in the current path between the power supply line and the gate of fourth pull-down n-channel MOS transistor 21D3 are made as separate transistors and/or the case where the n-channel MOS transistor positioned in the current path between the ground line and the gate of first pull-down n-channel MOS transistor 21, the n-channel MOS transistor positioned in the current path between the ground line and the gate of second pull-down n-channel MOS transistor 21D1, the n-channel MOS transistor positioned in the current path between the ground line and the gate of third pull-down n-channel MOS transistor 21D2, and the n-channel MOS transistor positioned in the current path between the ground line and the gate of fourth pull-down n-channel MOS transistor 21D3 are made as separate transistors.

Furthermore, in assist circuit 10D configured as above, an n-channel MOS transistor positioned in the current path between the power supply line and the gate of fifth pull-down n-channel MOS transistor 21D4, an n-channel MOS transistor positioned in the current path between the power supply line and the gate of sixth pull-down n-channel MOS transistor 21D5, an n-channel MOS transistor positioned in the current path between the power supply line and the gate of seventh pull-down n-channel MOS transistor 21D6, and an n-channel MOS transistor positioned in the current path between the power supply line and the gate of eighth pull-down n-channel MOS transistor 21D7 can be made as the common transistor, third series connection n-channel MOS transistor 22D. In addition, an n-channel MOS transistor positioned in the current path between the ground line and the gate of fifth pull-down n-channel MOS transistor 21D4, an n-channel MOS transistor positioned in the current path between the ground line and the gate of sixth pull-down n-channel MOS transistor 21D5, an n-channel MOS transistor positioned in the current path between the ground line and the gate of seventh pull-down n-channel MOS transistor 21D6, and an n-channel MOS transistor positioned in the current path between the ground line and the gate of eighth pull-down n-channel MOS transistor 21D7 can be made as the common transistor, fourth series connection n-channel MOS transistor 23D.

In this way, it is possible to reduce the area for making the n-channel MOS transistor(s), in comparison with the case where the n-channel MOS transistor positioned in the current path between the power supply line and the gate of fifth pull-down n-channel MOS transistor 21D4, the n-channel MOS transistor positioned in the current path between the power supply line and the gate of sixth pull-down n-channel MOS transistor 21D5, the n-channel MOS transistor positioned in the current path between the power supply line and the gate of seventh pull-down n-channel MOS transistor 21D6, and the n-channel MOS transistor positioned in the current path between the power supply line and the gate of eighth pull-down n-channel MOS transistor 21D7 are made as separate transistors and/or the case where the n-channel MOS transistor positioned in the current path between the ground line and the gate of fifth pull-down n-channel MOS transistor 21D4, the n-channel MOS transistor positioned in the current path between the ground line and the gate of sixth pull-down n-channel MOS transistor 21D5, the n-channel MOS transistor positioned in the current path between the ground line and the gate of seventh pull-down n-channel MOS transistor 21D6, and the n-channel MOS transistor positioned in the current path between the ground line and the gate of eighth pull-down n-channel MOS transistor 21D7 are made as separate transistors.

It should be noted that according to the descriptions in Embodiment 5, regarding assist circuit 10D, a number of M that is the number of pull-down n-channel MOS transistors whose gates are connected to first node 91 is four, and a number of M that is the number of n-channel MOS transistors connected to second node 91D is four.

By contrast, in another configuration example, M may be an integer greater than or equal to two except for four.

In this case, semiconductor memory device 1D includes assist circuits 10D whose number is one-2Mth the number of word lines 20.

Embodiment 6

Hereinafter, a semiconductor memory device according to Embodiment 6 is described which is configured by changing a part of the configuration of semiconductor memory device 1A according to Embodiment 2.

Here, constituent elements in the semiconductor memory device according to Embodiment 6 that are similar to those of semiconductor memory device 1A are assigned the same reference signs as those already described, and detailed descriptions thereof will be omitted, with the descriptions focusing on the differences from semiconductor memory device 1A.

Figure 13:
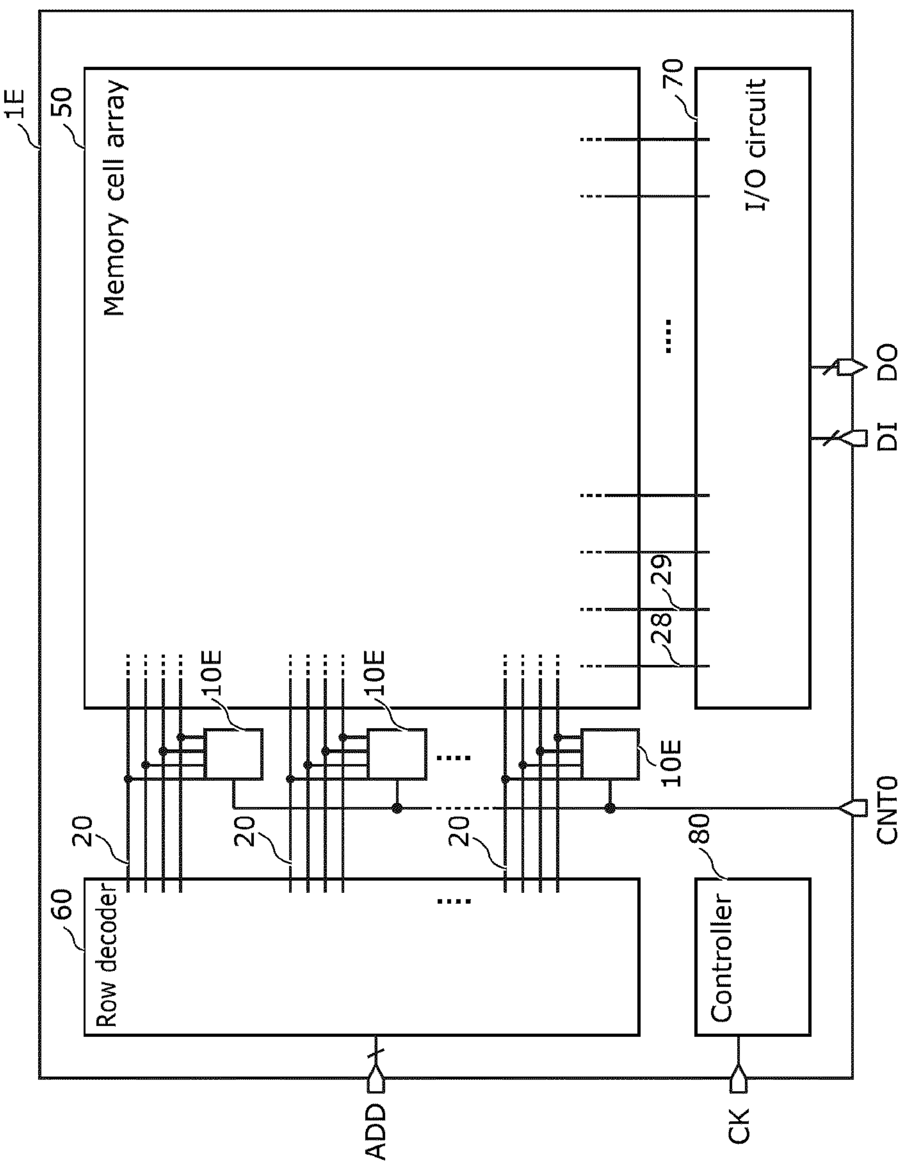
FIG. 13 is a block diagram illustrating a configuration of a semiconductor memory device according to Embodiment 6.

FIG. 13 is a block diagram illustrating a configuration of semiconductor memory device 1E according to Embodiment 6.

As illustrated in FIG. 13, semiconductor memory device 1E is configured by replacing four assist circuits 10A in semiconductor memory device 1A according to Embodiment 2 with one assist circuit 10E.

That is, each of a plurality of assist circuits 10E is connected to four word lines 20. Thus, semiconductor memory device 1E includes assist circuits 10E whose number is one-fourth the number of word lines 20.

Here, first control signal input terminal CNT0 is connected to all the gates of first p-channel MOS transistors 25 (see FIG. 14 described later) included in the plurality of assist circuits 10E.

Figure 14:
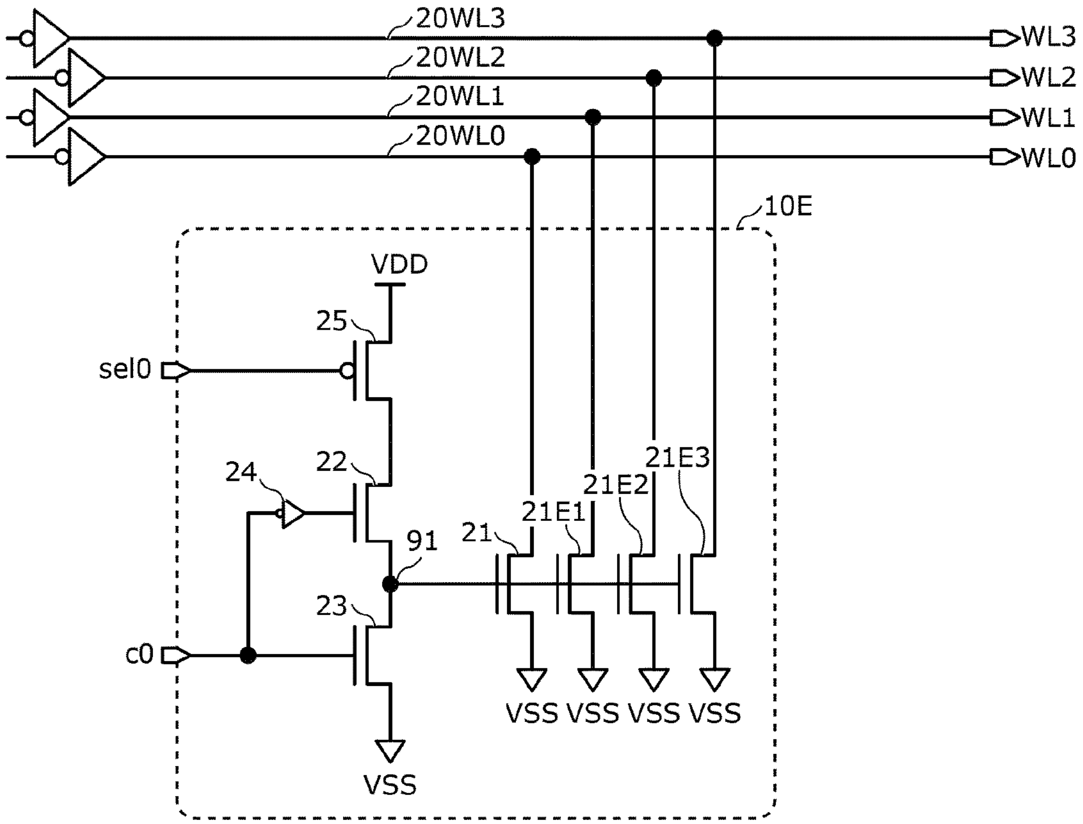
FIG. 14 is a circuit diagram illustrating a configuration of an assist circuit according to Embodiment 6.

FIG. 14 is a circuit diagram illustrating a configuration of assist circuit 10E. Here, four word lines 20 connected to assist circuit 10E are referred to as word line 20WL0, word line 20WL1, word line 20WL2, and word line 20WL3. That is, among four word lines 20 connected to assist circuit 10E, word line 20 connected to one or more memory cells 40 that form a given row (for example, the zero-th row) of memory cell array 50 is referred to as word line 20WL0, word line 20 connected to one or more memory cells 40 that form another row (for example, the first row) of memory cell array 50 is referred to as word line 20WL1, word line 20 connected to one or more memory cells 40 that form yet another row (for example, the second row) of memory cell array 50 is referred to as word line 20WL2, and word line 20 connected to one or more memory cells 40 that form yet another row (for example, the third row) of memory cell array 50 is referred to as word line 20WL3.

As illustrated in FIG. 14, assist circuit 10E is configured by adding, to assist circuit 10A according to Embodiment 2, second pull-down n-channel MOS transistor 21E1, third pull-down n-channel MOS transistor 21E2, and fourth pull-down n-channel MOS transistor 21E3. The drain, source, and gate of second pull-down n-channel MOS transistor 21E1 are respectively connected to word line 20 (here, word line 20WL1), a ground line, and first node 91. The drain, source, and gate of third pull-down n-channel MOS transistor 21E2 are respectively connected to word line 20 (here, word line 20WL2), the ground line, and first node 91. The drain, source, and gate of fourth pull-down n-channel MOS transistor 21E3 are respectively connected to word line 20 (here, word line 20WL3), the ground line, and first node 91.

<Observations>

In assist circuit 10E configured as above, the drain of first series connection n-channel MOS transistor 22 is connected to a power supply line via first p-channel MOS transistor 25.

Thus, when a first control signal with a logic value of 0 has been input by first control signal input terminal CNT0, that is, when the voltage of terminal sel0 is VSS, first p-channel MOS transistor 25 becomes conductive. As such, in assist circuit 10E, when a logic value of 0 is input to terminal c0, that is, the voltage of terminal c0 is changed to VSS, first series connection n-channel MOS transistor 22 becomes conductive, and second series connection n-channel MOS transistor 23 becomes non-conductive.

In this way, the voltage of first node 91, that is, the gate voltages of first pull-down n-channel MOS transistor 21, second pull-down n-channel MOS transistor 21E1, third pull-down n-channel MOS transistor 21E2, and fourth pull-down n-channel MOS transistor 21E3 are changed to VDD-Vtn.

Meanwhile, when the first control signal with a logic value of 1 has been input by first control signal input terminal CNT0, that is, when the voltage of terminal sel0 is VDD, first p-channel MOS transistor 25 becomes non-conductive.

Thus, in assist circuit 10E, once a logic value of 1 is input to terminal c0, that is, once the voltage of terminal c0 is changed to VDD, second series connection n-channel MOS transistor 23 becomes conductive, and the voltage of first node 91 is reset (changed to VSS). After that, the voltage of first node 91 will not be higher than VSS, that is, each of first pull-down n-channel MOS transistor 21, second pull-down n-channel MOS transistor 21E1, third pull-down n-channel MOS transistor 21E2, and fourth pull-down n-channel MOS transistor 21E3 will not pull down the voltage of a corresponding one of word line 20WL0, word line 20WL1, word line 20WL2, and word line 20WL3 in an active state to decrease the voltage.

As such, by controlling the first control signal, semiconductor memory device 1E configured as above can perform control as to whether to enable the assist function of word line 20 in an active state.

In assist circuit 10E configured as above, an n-channel MOS transistor positioned in the current path between the power supply line and the gate of first pull-down n-channel MOS transistor 21, an n-channel MOS transistor positioned in the current path between the power supply line and the gate of second pull-down n-channel MOS transistor 21E1, an n-channel MOS transistor positioned in the current path between the power supply line and the gate of third pull-down n-channel MOS transistor 21E2, and an n-channel MOS transistor positioned in the current path between the power supply line and the gate of fourth pull-down n-channel MOS transistor 21E3 can be made as the common transistor, first series connection n-channel MOS transistor 22. In addition, an n-channel MOS transistor positioned in the current path between the ground line and the gate of first pull-down n-channel MOS transistor 21, an n-channel MOS transistor positioned in the current path between the ground line and the gate of second pull-down n-channel MOS transistor 21E1, an n-channel MOS transistor positioned in the current path between the ground line and the gate of third pull-down n-channel MOS transistor 21E2, and an n-channel MOS transistor positioned in the current path between the ground line and the gate of fourth pull-down n-channel MOS transistor 21E3 can be made as the common transistor, second series connection n-channel MOS transistor 23.

Thus, it is possible to increase the size of first series connection n-channel MOS transistor 22, in comparison with the case where the n-channel MOS transistor positioned in the current path between the power supply line and the gate of first pull-down n-channel MOS transistor 21, the n-channel MOS transistor positioned in the current path between the power supply line and the gate of second pull-down n-channel MOS transistor 21E1, the n-channel MOS transistor positioned in the current path between the power supply line and the gate of third pull-down n-channel MOS transistor 21E2, and the n-channel MOS transistor positioned in the current path between the power supply line and the gate of fourth pull-down n-channel MOS transistor 21E3 are made as separate transistors.

In this way, it is possible to suppress variations in Vtn of first series connection n-channel MOS transistor 22.

It should be noted that according to the descriptions in Embodiment 6, regarding assist circuit 10E, a number of M that is the number of pull-down n-channel MOS transistors whose gates are connected to first node 91 is four.

By contrast, in another configuration example, M may be an integer greater than or equal to two except for four.

In this case, semiconductor memory device 1E includes assist circuits 10E whose number is one-Mth the number of word lines 20.

Embodiment 7

Hereinafter, a semiconductor memory device according to Embodiment 7 is described which is configured by changing a part of the configuration of semiconductor memory device 1A according to Embodiment 2.

Here, constituent elements in the semiconductor memory device according to Embodiment 7 that are similar to those of semiconductor memory device 1A are assigned the same reference signs as those already described, and detailed descriptions thereof will be omitted, with the descriptions focusing on the differences from semiconductor memory device 1A.

<Configuration>

Figure 15:
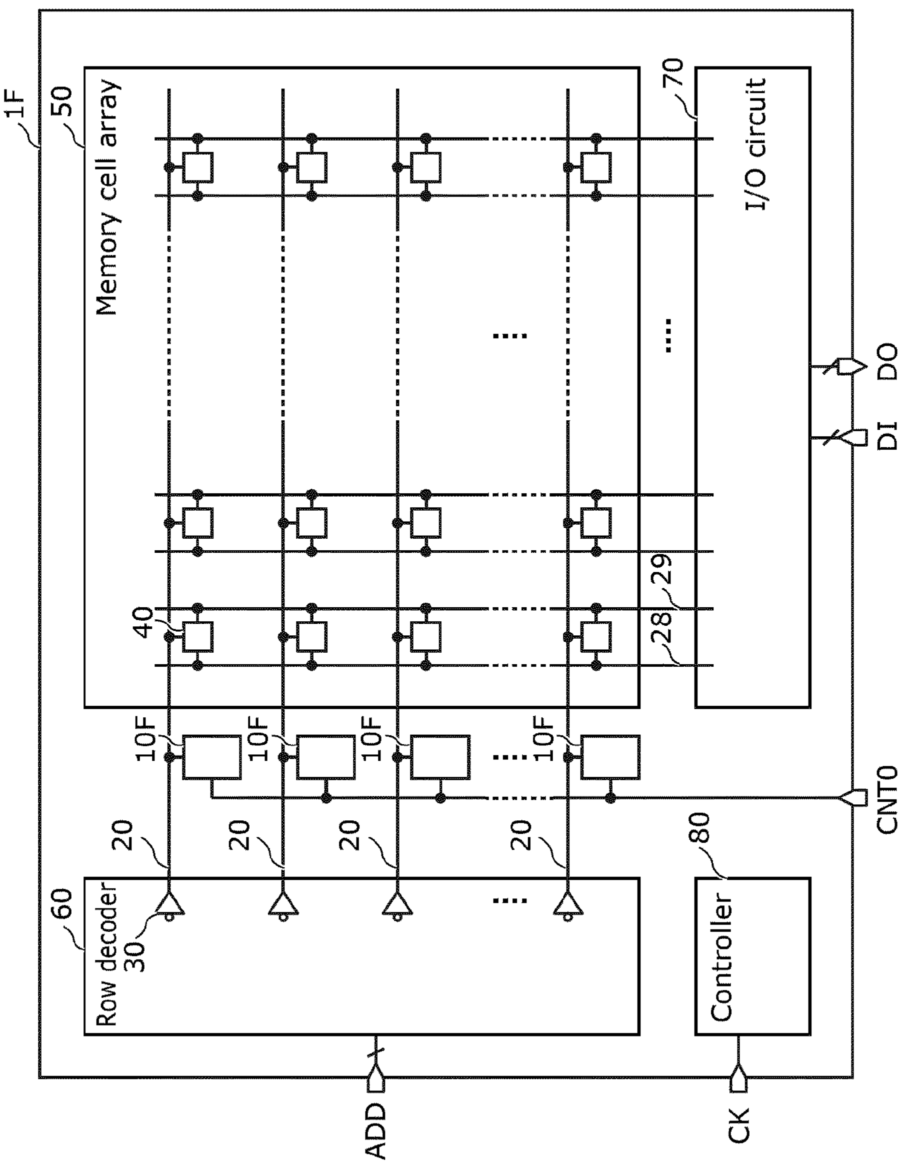
FIG. 15 is a block diagram illustrating a configuration of a semiconductor memory device according to Embodiment 7.

FIG. 15 is a block diagram illustrating a configuration of semiconductor memory device 1F according to Embodiment 7.

As illustrated in FIG. 15, semiconductor memory device 1F is configured by replacing assist circuit 10A in semiconductor memory device 1A according to Embodiment 2 with assist circuit 10F.

Here, first control signal input terminal CNT0 is connected to all the gates of first p-channel MOS transistors 25 (see FIG. 16 described later) included in a plurality of assist circuits 10F.

Figure 16:
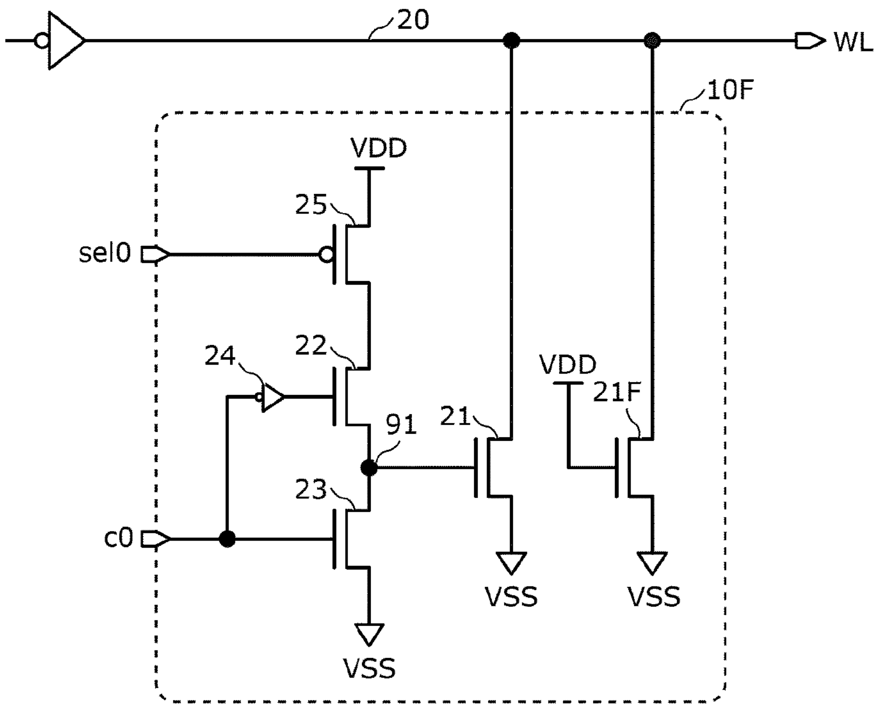
FIG. 16 is a circuit diagram illustrating a configuration of an assist circuit according to Embodiment 7.

FIG. 16 is a circuit diagram illustrating a configuration of assist circuit 10F.

As illustrated in FIG. 16, assist circuit 10F is configured by adding, to assist circuit 10A according to Embodiment 2, second pull-down n-channel MOS transistor 21F whose drain, source, and gate are respectively connected to word line 20, a ground line, and a power supply line.

<Observations>

In assist circuit 10F configured as above, the voltage of word line 20 is pulled down by first pull-down n-channel MOS transistor 21 whose gate voltage is VDD-Vtn and second pull-down n-channel MOS transistor 21F whose gate voltage is VDD.

Figure 17:
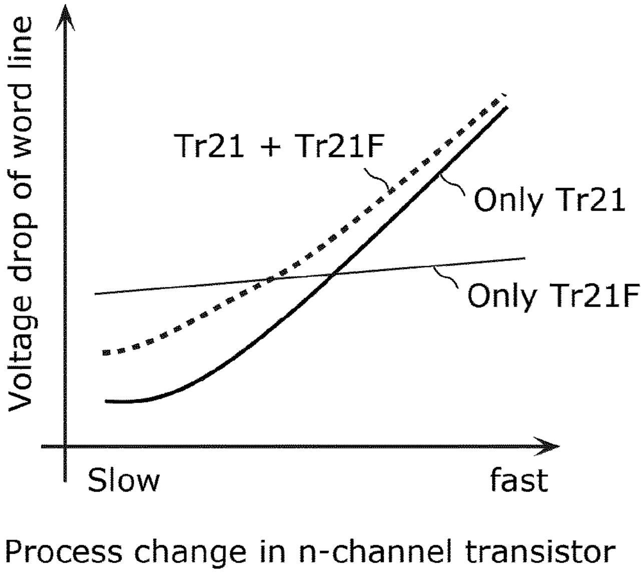
FIG. 17 is a schematic diagram illustrating relationships between a process variation condition and a voltage drop.

FIG. 17 is a schematic diagram illustrating relationships between the process variation condition of the n-channel MOS transistors and the voltage drop of word line 20 in the following cases: (1) the voltage of word line 20 is pulled down by the two transistors, second pull-down n-channel MOS transistor 21F whose gate voltage is VDD and first pull-down n-channel MOS transistor 21 whose gate voltage is VDD-Vtn, (2) the voltage of word line 20 is pulled down by only second pull-down n-channel MOS transistor 21F whose gate voltage is VDD, and (3) the voltage of word line 20 is pulled down by only first pull-down n-channel MOS transistor 21 whose gate voltage is VDD-Vtn.

In FIG. 17, the horizontal axis indicates the degree of change in the process variation condition of the n-channel MOS transistors, and the vertical axis indicates the voltage drop of word line 20.

As illustrated in FIG. 17, the voltage drop of word line 20 can be controlled more sensitively in case (1) where the voltage of word line 20 is pulled down by the two transistors, second pull-down n-channel MOS transistor 21F whose gate voltage is VDD and first pull-down n-channel MOS transistor 21 whose gate voltage is VDD-Vtn, than in case (2) where the voltage of word line 20 is pulled down by only second pull-down n-channel MOS transistor 21F whose gate voltage is VDD and in case (3) where the voltage of word line 20 is pulled down by only first pull-down n-channel MOS transistor 21 whose gate voltage is VDD-Vtn.

As such, semiconductor memory device 1F configured as above can control the voltage drop of word line 20 more sensitively.

Embodiment 8

Hereinafter, a semiconductor memory device according to Embodiment 8 is described which is configured by changing a part of the configuration of semiconductor memory device 1A according to Embodiment 2.

Here, constituent elements in the semiconductor memory device according to Embodiment 8 that are similar to those of semiconductor memory device 1A are assigned the same reference signs as those already described, and detailed descriptions thereof will be omitted, with the descriptions focusing on the differences from semiconductor memory device 1A.

Configuration

Figure 18:
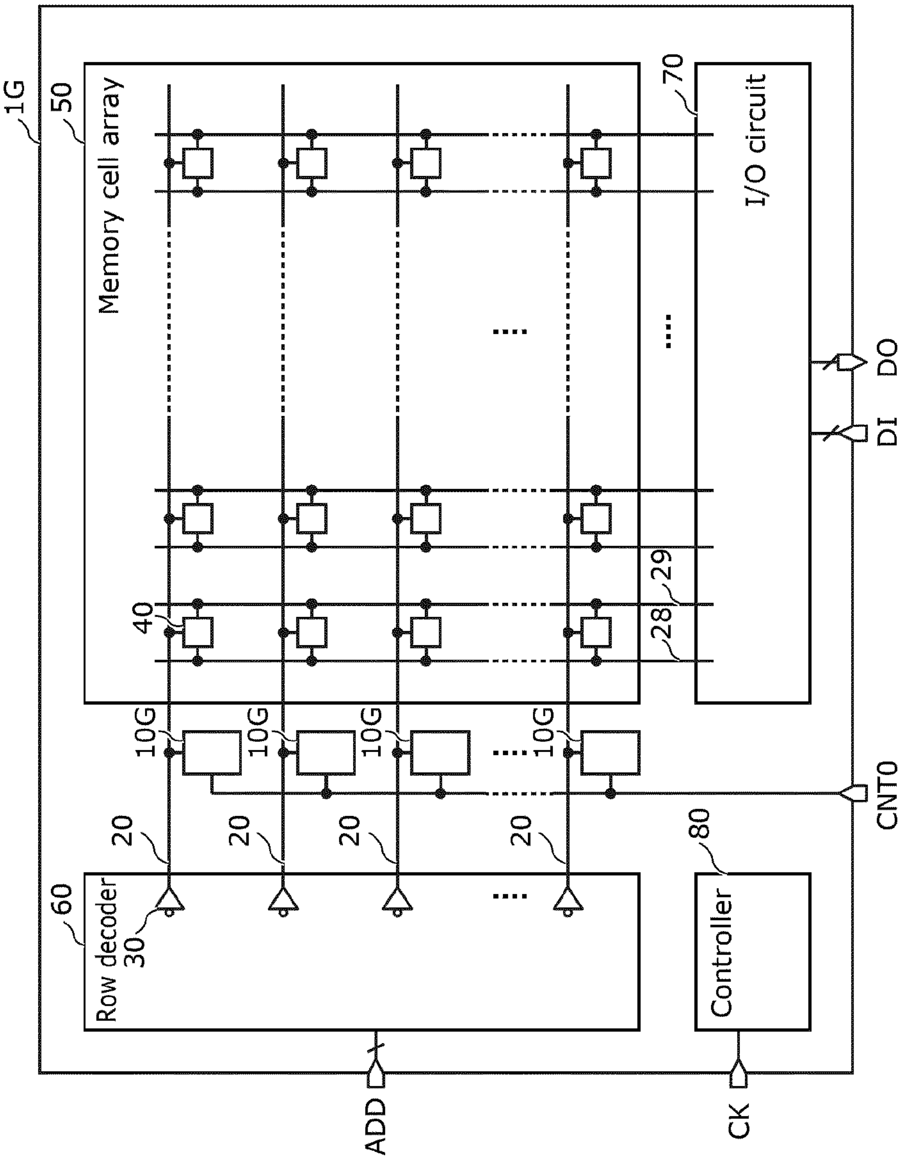
FIG. 18 is a block diagram illustrating a configuration of a semiconductor memory device according to Embodiment 8.

FIG. 18 is a block diagram illustrating a configuration of semiconductor memory device 1G according to Embodiment 8.

As illustrated in FIG. 18, semiconductor memory device 1G is configured by replacing assist circuit 10A in semiconductor memory device 1A according to Embodiment 2 with assist circuit 10G.

Here, first control signal input terminal CNT0 is connected to all the gates of first p-channel MOS transistors 25 (see FIG. 19 described later) included in a plurality of assist circuits 10G.

Figure 19:
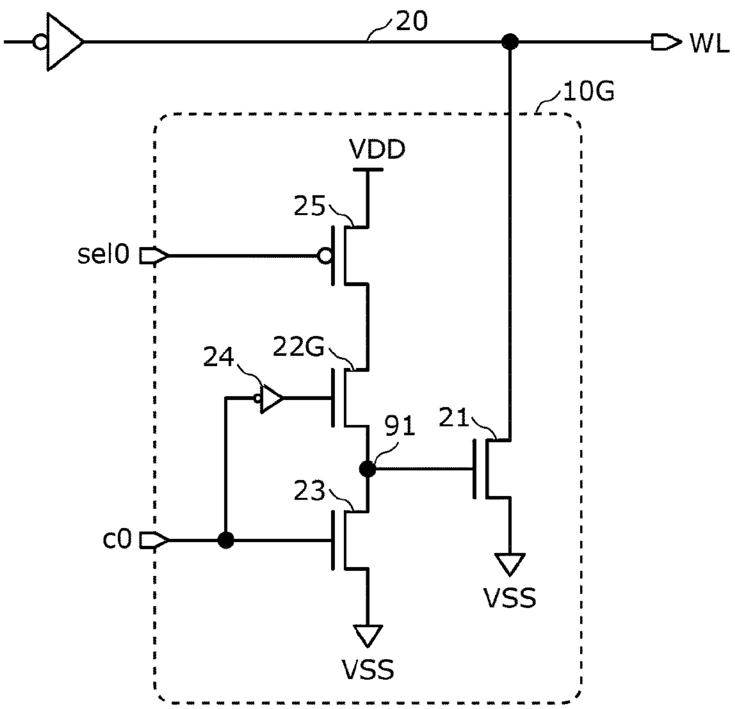
FIG. 19 is a circuit diagram illustrating a configuration of an assist circuit according to Embodiment 8.

FIG. 19 is a circuit diagram illustrating a configuration of assist circuit 10G.

As illustrated in FIG. 19, assist circuit 10G is configured by replacing first series connection n-channel MOS transistor 22 in assist circuit 10A according to according to Embodiment 2 with first series connection n-channel MOS transistor 22G.

Here, the threshold of first series connection n-channel MOS transistor 22G is lower than the threshold of first pull-down n-channel MOS transistor 21 and the threshold of second series connection n-channel MOS transistor 23.

<Observations>

In semiconductor memory device 1G configured as above, when a power supply voltage is set to a low voltage, the gate voltage of first pull-down n-channel MOS transistor 21 will be lower than the threshold voltage of first pull-down n-channel MOS transistor 21. As a result, an occurrence of inconvenience of first pull-down n-channel MOS transistor 21 not being able to pull down word line 20 can be suppressed.

Thus, in semiconductor memory device 1G configured as above, it is possible to expand a low-voltage operation area for the pull-down operation of word line 20.

Embodiment 9

Hereinafter, a semiconductor memory device according to Embodiment 9 is described which is configured by changing a part of the configuration of semiconductor memory device 1A according to Embodiment 2.

Here, constituent elements in the semiconductor memory device according to Embodiment 9 that are similar to those of semiconductor memory device 1A are assigned the same reference signs as those already described, and detailed descriptions thereof will be omitted, with the descriptions focusing on the differences from semiconductor memory device 1A.

<Configuration>

Figure 20:
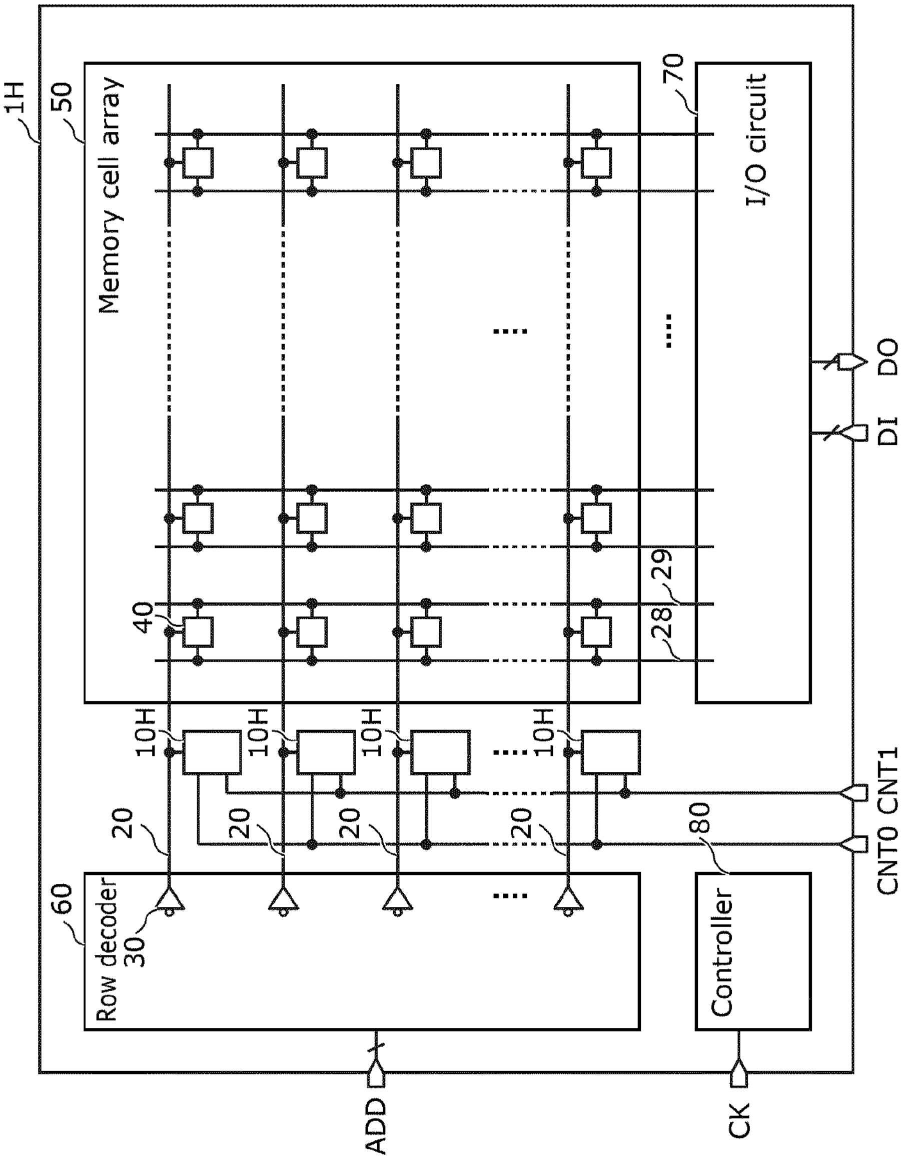
FIG. 20 is a block diagram illustrating a configuration of a semiconductor memory device according to Embodiment 9.

FIG. 20 is a block diagram illustrating a configuration of semiconductor memory device 1H according to Embodiment 9.

As illustrated in FIG. 20, semiconductor memory device 1H is configured by adding second control signal input terminal CNT1 to semiconductor memory device 1A according to Embodiment 2 and replacing assist circuit 10A in semiconductor memory device 1A with assist circuit 10H.

Here, first control signal input terminal CNT0 is connected to all the gates of first p-channel MOS transistors 25 (see FIG. 21 described later) included in a plurality of assist circuits 10H. Second control signal input terminal CNT1 is connected to all the gates of second p-channel MOS transistors 25H (see FIG. 21 described later) included in the plurality of assist circuits 10H.

Figure 21:
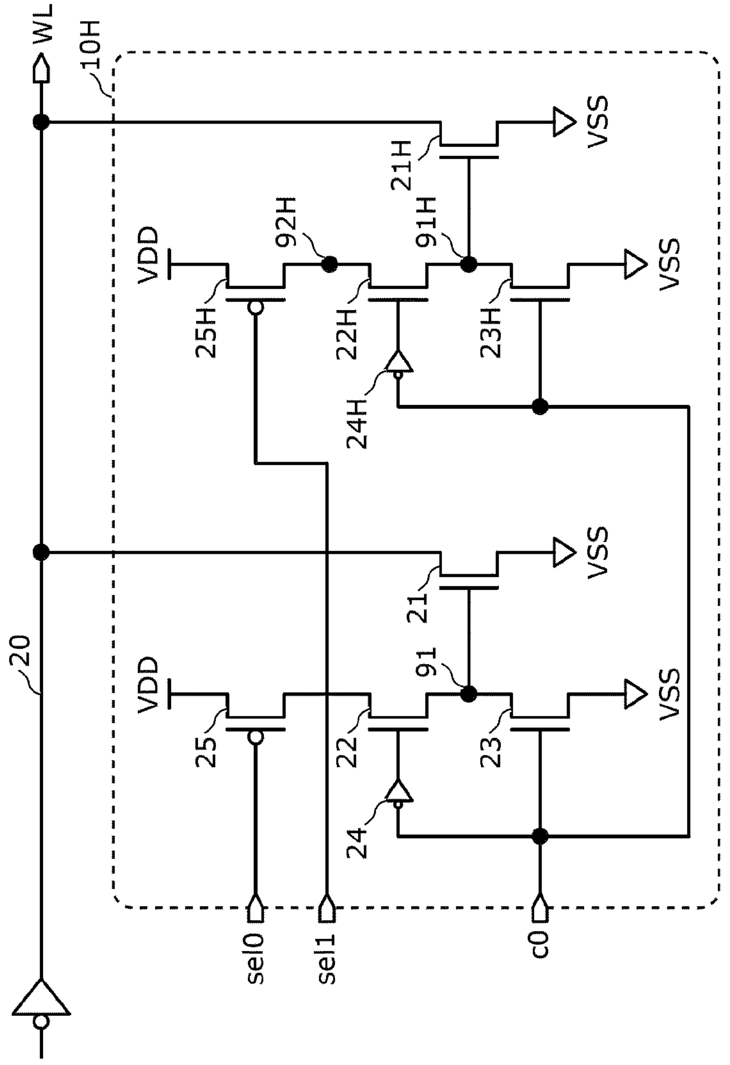
FIG. 21 is a circuit diagram illustrating a configuration of an assist circuit according to Embodiment 9.

FIG. 21 is a circuit diagram illustrating a configuration of assist circuit 10H.

As illustrated in FIG. 21, assist circuit 10H is configured by adding, to assist circuit 10A according to Embodiment 2, second pull-down n-channel MOS transistor 21H, second p-channel MOS transistors 25H, third series connection n-channel MOS transistor 22H, fourth series connection n-channel MOS transistor 23H, and inverter 24H. The drain, source, and gate of second pull-down n-channel MOS transistor 21H are respectively connected to word line 20, a ground line, and second node 91H. The drain and source of second p-channel MOS transistors 25H are respectively connected to third node 92H and a power supply line. The drain and source of third series connection n-channel MOS transistor 22H are respectively connected to third node 92H and second node 91H. The drain and source of fourth series connection n-channel MOS transistor 23H are respectively connected to second node 91H and the ground line. Inverter 24H is connected in order to input, to the gate of third series connection n-channel MOS transistor 22H, the inverse-logic signal of a signal to be input to the gate of fourth series connection n-channel MOS transistor 23H.

Moreover, the gate of second p-channel MOS transistors 25H is connected to second control signal input terminal CNT1 via terminal sell.

<Observations>

By controlling a first control signal, semiconductor memory device 1H configured as above can perform control as to whether to enable an assist function using first pull-down n-channel MOS transistor 21. By controlling a second control signal, semiconductor memory device 1H configured as above can perform control as to whether to enable an assist function using second pull-down n-channel MOS transistor 21H.

In this way, semiconductor memory device 1H configured as above can select from among the choices: (1) pulling down word line 20 by using first pull-down n-channel MOS transistor 21, (2) pulling down word line 20 by using second pull-down n-channel MOS transistor 21H, (3) pulling down word line 20 by using first pull-down n-channel MOS transistor 21 and second pull-down n-channel MOS transistor 21H, and (4) not pulling down word line 20.

Embodiment 10

Hereinafter, a semiconductor memory device according to Embodiment 10 is described which is configured by changing a part of the configuration of semiconductor memory device 1B according to Embodiment 3.

Here, constituent elements in the semiconductor memory device according to Embodiment 10 that are similar to those of semiconductor memory device 1B are assigned the same reference signs as those already described, and detailed descriptions thereof will be omitted, with the descriptions focusing on the differences from semiconductor memory device 1B.

Figure 22:
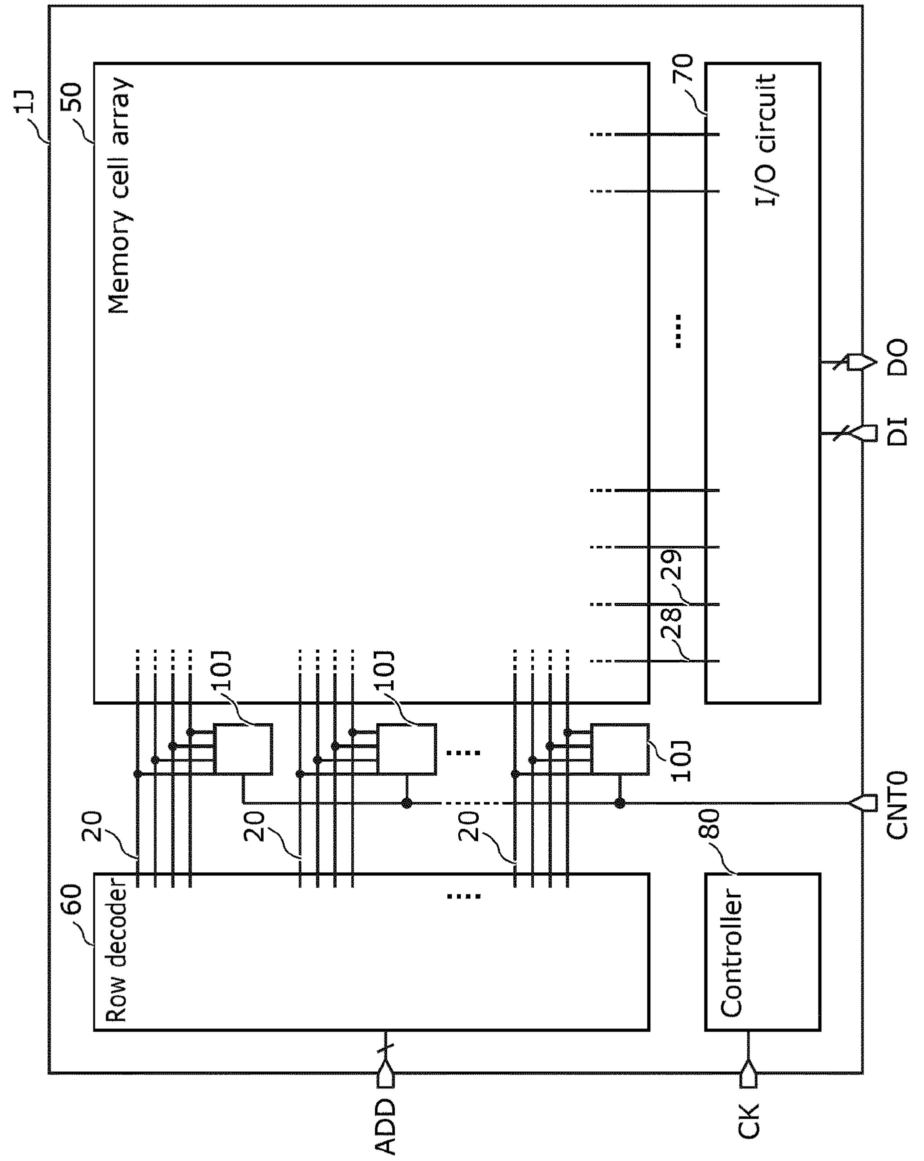
FIG. 22 is a block diagram illustrating a configuration of a semiconductor memory device according to Embodiment 10.

FIG. 22 is a block diagram illustrating a configuration of semiconductor memory device 1J according to Embodiment 10.

As illustrated in FIG. 22, semiconductor memory device 1J is configured by replacing four assist circuits 10B in semiconductor memory device 1B according to Embodiment 3 with one assist circuit 10J.

That is, each of a plurality of assist circuits 10J is connected to four word lines 20. Thus, semiconductor memory device 1J includes assist circuits 10J whose number is one-fourth the number of word lines 20.

Here, first control signal input terminal CNT0 is connected to all the gates of first series connection n-channel MOS transistor 22B (see FIG. 23 described later) included in the plurality of assist circuits 10J and described later.

Figure 23:
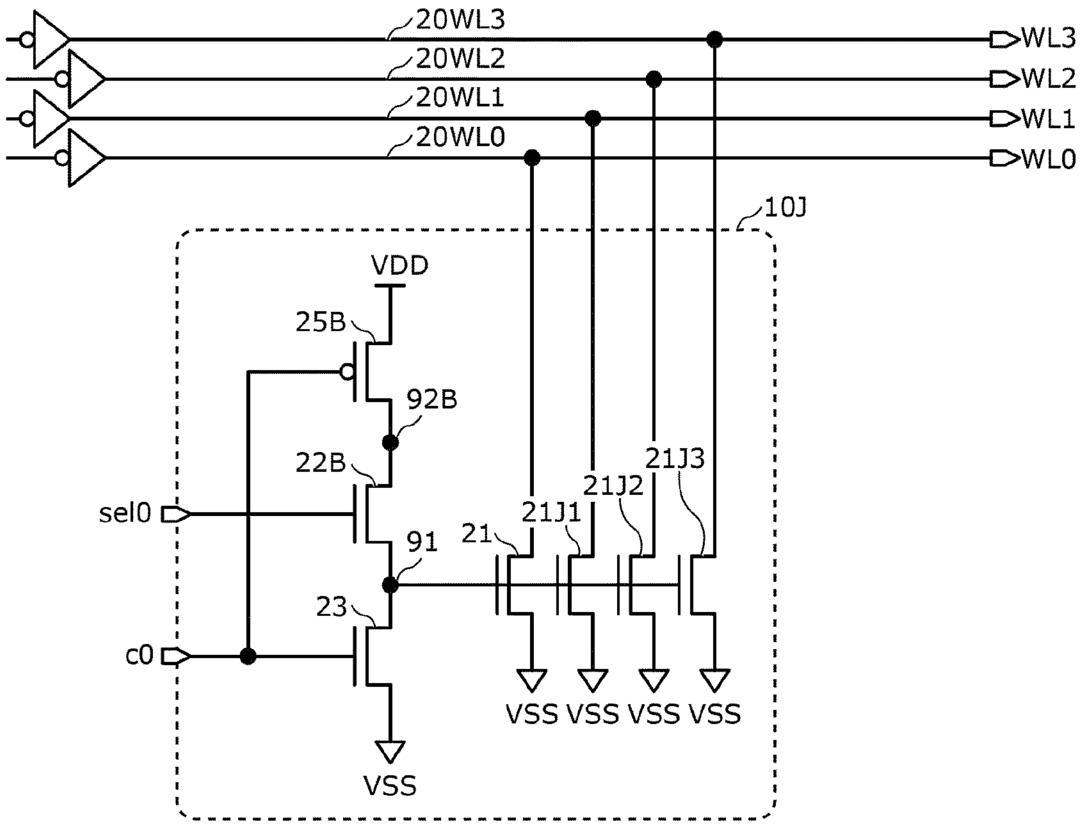
FIG. 23 is a circuit diagram illustrating a configuration of an assist circuit according to Embodiment 10.

FIG. 23 is a circuit diagram illustrating a configuration of assist circuit 10J. Here, four word lines 20 connected to assist circuit 10J are referred to as word line 20WL0, word line 20WL1, word line 20WL2, and word line 20WL3. That is, among four word lines 20 connected to assist circuit 10J, word line 20 connected to one or more memory cells 40 that form a given row (for example, the zero-th row) of memory cell array 50 is referred to as word line 20WL0, word line 20 connected to one or more memory cells 40 that form another row (for example, the first row) of memory cell array 50 is referred to as word line 20WL1, word line 20 connected to one or more memory cells 40 that form yet another row (for example, the second row) of memory cell array 50 is referred to as word line 20WL2, and word line 20 connected to one or more memory cells 40 that form yet another row (for example, the third row) of memory cell array 50 is referred to as word line 20WL3.

As illustrated in FIG. 23, assist circuit 10J is configured by adding, to assist circuit 10B according to Embodiment 3, second pull-down n-channel MOS transistor 21J1, third pull-down n-channel MOS transistor 21J2, and fourth pull-down n-channel MOS transistor 21J3. The drain, source, and gate of second pull-down n-channel MOS transistor 21J1 are respectively connected to word line 20 (here, word line 20WL1), a ground line, and first node 91. The drain, source, and gate of third pull-down n-channel MOS transistor 21J2 are respectively connected to word line 20 (here, word line 20WL2), the ground line, and first node 91. The drain, source, and gate of fourth pull-down n-channel MOS transistor 21J3 are respectively connected to word line 20 (here, word line 20WL3), the ground line, and first node 91.

<Observations>

In assist circuit 10J configured as above, the drain of first series connection n-channel MOS transistor 22B (that is, second node 92B) is connected to a power supply line via first p-channel MOS transistor 25B.

Thus, when a first control signal with a logic value of 1 has been input by first control signal input terminal CNT0, that is, when the voltage of terminal sel0 is VDD, first series connection n-channel MOS transistor 22B becomes conductive. As such, in assist circuit 10J, when a logic value of 0 is input to terminal c0, that is, the voltage of terminal c0 is changed to VSS, first p-channel MOS transistor 25B becomes conductive, and second series connection n-channel MOS transistor 23 becomes non-conductive.

In this way, the voltage of first node 91, that is, the gate voltage of first pull-down n-channel MOS transistor 21 is changed to VDD-Vtn.

Meanwhile, when the first control signal with a logic value of 0 has been input by first control signal input terminal CNT0, that is, when the voltage of terminal sel0 is VSS, first series connection n-channel MOS transistor 22B becomes non-conductive.

Thus, in assist circuit 10J, once a logic value of 1 is input to terminal c0, that is, once the voltage of terminal c0 is changed to VDD, second series connection n-channel MOS transistor 23 becomes conductive, and the voltage of first node 91 is reset (changed to VSS). After that, the voltage of first node 91 will not be higher than VSS, that is, each of first pull-down n-channel MOS transistor 21, second pull-down n-channel MOS transistor 21J1, third pull-down n-channel MOS transistor 21J2, and fourth pull-down n-channel MOS transistor 21J3 will not pull down the voltage of a corresponding one of word line 20WL0, word line 20WL1, word line 20WL2, and word line 20WL3 in an active state to decrease the voltage.

As such, by controlling the first control signal, semiconductor memory device 1J configured as above can perform control as to whether to enable the assist function of word line 20 in an active state.

In assist circuit 10J configured as above, an n-channel MOS transistor positioned in the current path between the power supply line and the gate of first pull-down n-channel MOS transistor 21, an n-channel MOS transistor positioned in the current path between the power supply line and the gate of second pull-down n-channel MOS transistor 21J1, an n-channel MOS transistor positioned in the current path between the power supply line and the gate of third pull-down n-channel MOS transistor 21J2, and an n-channel MOS transistor positioned in the current path between the power supply line and the gate of fourth pull-down n-channel MOS transistor 21J3 can be made as the common transistor, first series connection n-channel MOS transistor 22B. In addition, an n-channel MOS transistor positioned in the current path between the ground line and the gate of first pull-down n-channel MOS transistor 21, an n-channel MOS transistor positioned in the current path between the ground line and the gate of second pull-down n-channel MOS transistor 21J1, an n-channel MOS transistor positioned in the current path between the ground line and the gate of third pull-down n-channel MOS transistor 21J2, and an n-channel MOS transistor positioned in the current path between the ground line and the gate of fourth pull-down n-channel MOS transistor 21J3 can be made as the common transistor, second series connection n-channel MOS transistor 23.

Thus, it is possible to increase the size of first series connection n-channel MOS transistor 22B, in comparison with the case where the n-channel MOS transistor positioned in the current path between the power supply line and the gate of first pull-down n-channel MOS transistor 21, the n-channel MOS transistor positioned in the current path between the power supply line and the gate of second pull-down n-channel MOS transistor 21J1, the n-channel MOS transistor positioned in the current path between the power supply line and the gate of third pull-down n-channel MOS transistor 21J2, and the n-channel MOS transistor positioned in the current path between the power supply line and the gate of fourth pull-down n-channel MOS transistor 21J3 are made as separate transistors.

Thus, it is possible to suppress variations in Vtn of first series connection n-channel MOS transistor 22B.

It should be noted that according to the descriptions in Embodiment 10, regarding assist circuit 10J, a number of M that is the number of pull-down n-channel MOS transistors whose gates are connected to first node 91 is four.

By contrast, in another configuration example, M may be an integer greater than or equal to two except for four.

In this case, semiconductor memory device 1J includes assist circuits 10J whose number is one-Mth the number of word lines 20.

Embodiment 11

Hereinafter, a semiconductor memory device according to Embodiment 11 is described which is configured by changing a part of the configuration of semiconductor memory device 1B according to Embodiment 3.

Here, constituent elements in the semiconductor memory device according to Embodiment 11 that are similar to those of semiconductor memory device 1B are assigned the same reference signs as those already described, and detailed descriptions thereof will be omitted, with the descriptions focusing on the differences from semiconductor memory device 1B.

<Configuration>

Figure 24:
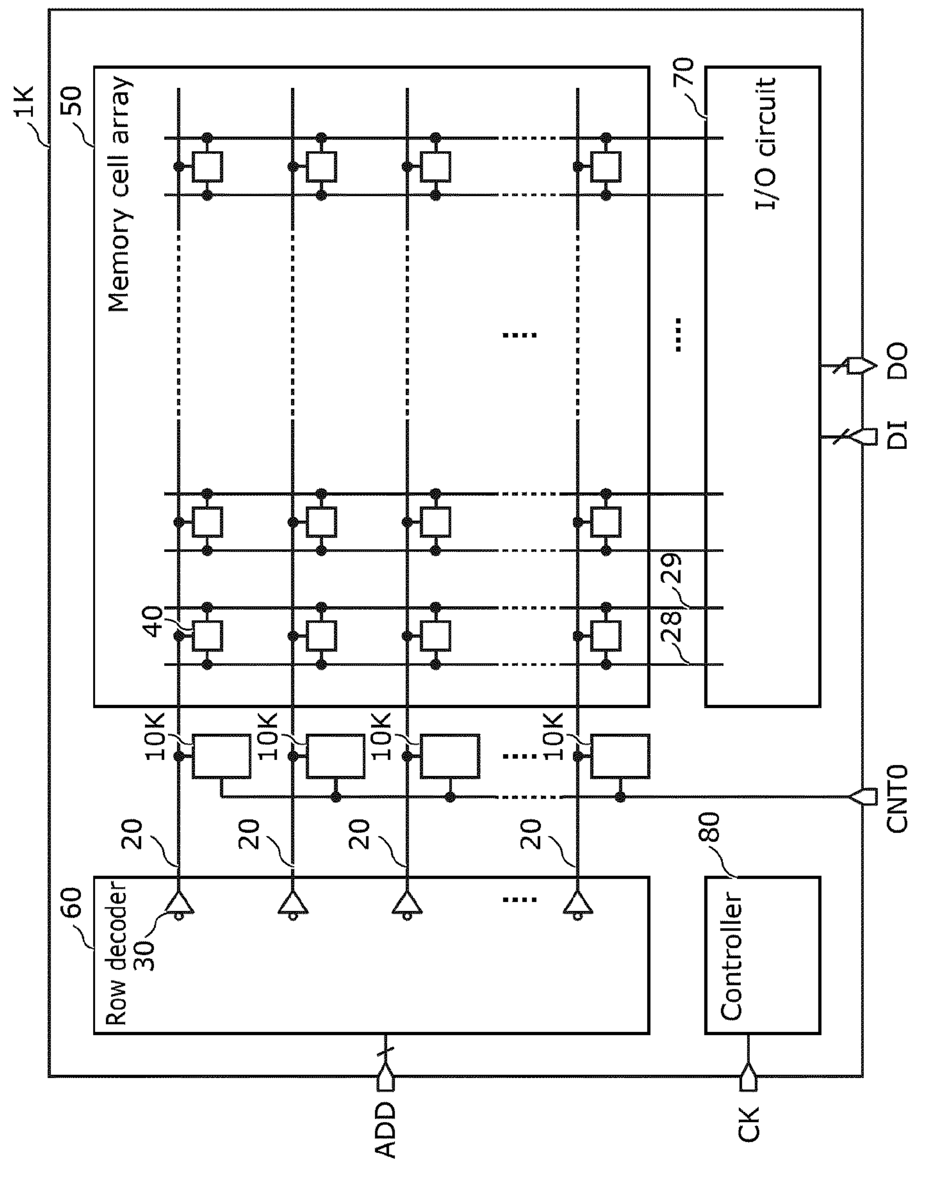
FIG. 24 is a block diagram illustrating a configuration of a semiconductor memory device according to Embodiment 11.

FIG. 24 is a block diagram illustrating a configuration of semiconductor memory device 1K according to Embodiment 11.

As illustrated in FIG. 24, semiconductor memory device 1K is configured by replacing assist circuit 10B in semiconductor memory device 1B according to Embodiment 3 with assist circuit 10K.

Here, first control signal input terminal CNT0 is connected to all the gates of first series connection n-channel MOS transistor 22B (see FIG. 25 described later) included in a plurality of assist circuits 10K and described later.

Figure 25:
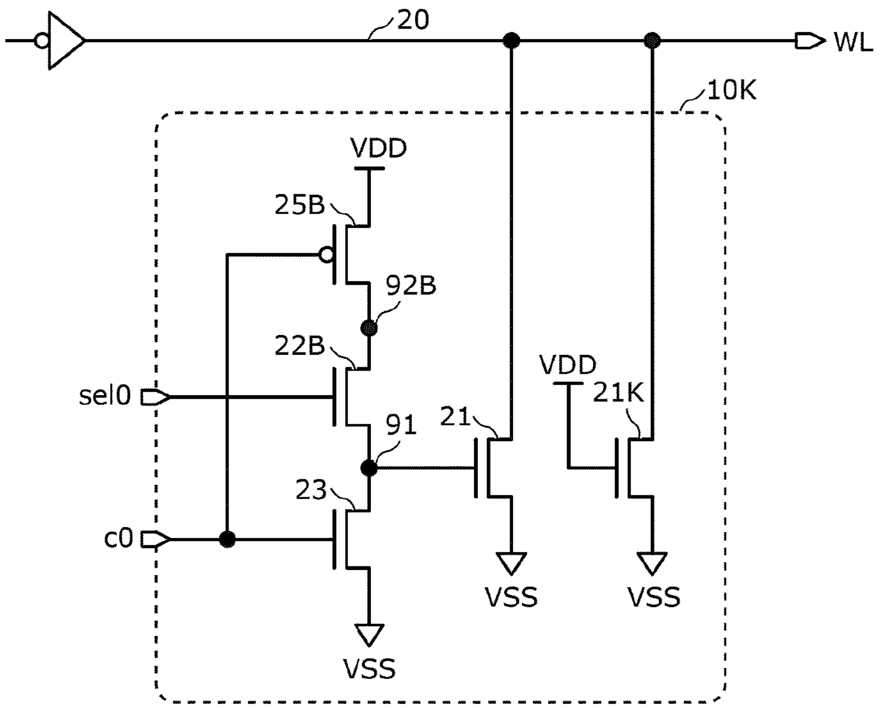
FIG. 25 is a circuit diagram illustrating a configuration of an assist circuit according to Embodiment 11.

FIG. 25 is a circuit diagram illustrating a configuration of assist circuit 10K.

As illustrated in FIG. 25, assist circuit 10K is configured by adding, to assist circuit 10B according to Embodiment 3, second pull-down n-channel MOS transistor 21K whose drain, source, and gate are respectively connected to word line 20, a ground line, and a power supply line.

<Observations>

In assist circuit 10K configured as above, the voltage of word line 20 is pulled down by first pull-down n-channel MOS transistor 21 whose gate voltage is VDD-Vtn and second pull-down n-channel MOS transistor 21K whose gate voltage is VDD.

Figure 26:
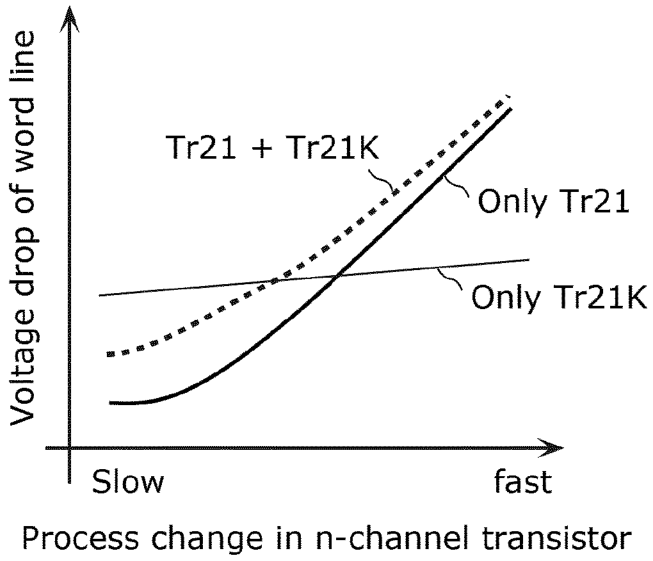
FIG. 26 is a schematic diagram illustrating relationships between a process variation condition and a voltage drop.

FIG. 26 is a schematic diagram illustrating relationships between the process variation condition of n-channel MOS transistors and the voltage drop of word line 20 in the following cases: (1) the voltage of word line 20 is pulled down by the two transistors, second pull-down n-channel MOS transistor 21K whose gate voltage is VDD and first pull-down n-channel MOS transistor 21 whose gate voltage is VDD-Vtn, (2) the voltage of word line 20 is pulled down by only second pull-down n-channel MOS transistor 21K whose gate voltage is VDD, and (3) the voltage of word line 20 is pulled down by only first pull-down n-channel MOS transistor 21 whose gate voltage is VDD-Vtn.

In FIG. 26, the horizontal axis indicates the degree of change in the process variation condition of the n-channel MOS transistors, and the vertical axis indicates the voltage drop of word line 20.

As illustrated in FIG. 26, the voltage drop of word line 20 can be controlled more sensitively in case (1) where the voltage of word line 20 is pulled down by the two transistors, second pull-down n-channel MOS transistor 21K whose gate voltage is VDD and first pull-down n-channel MOS transistor 21 whose gate voltage is VDD-Vtn, than in case (2) where the voltage of word line 20 is pulled down by only second pull-down n-channel MOS transistor 21K whose gate voltage is VDD and in case (3) where the voltage of word line 20 is pulled down by only first pull-down n-channel MOS transistor 21 whose gate voltage is VDD-Vtn.

As such, semiconductor memory device 1K configured as above can control the voltage drop of word line 20 more sensitively.

Embodiment 12

Hereinafter, a semiconductor memory device according to Embodiment 12 is described which is configured by changing a part of the configuration of semiconductor memory device 1B according to Embodiment 3.

Here, constituent elements in the semiconductor memory device according to Embodiment 12 that are similar to those of semiconductor memory device 1B are assigned the same reference signs as those already described, and detailed descriptions thereof will be omitted, with the descriptions focusing on the differences from semiconductor memory device 1B.

<Configuration>

Figure 27:
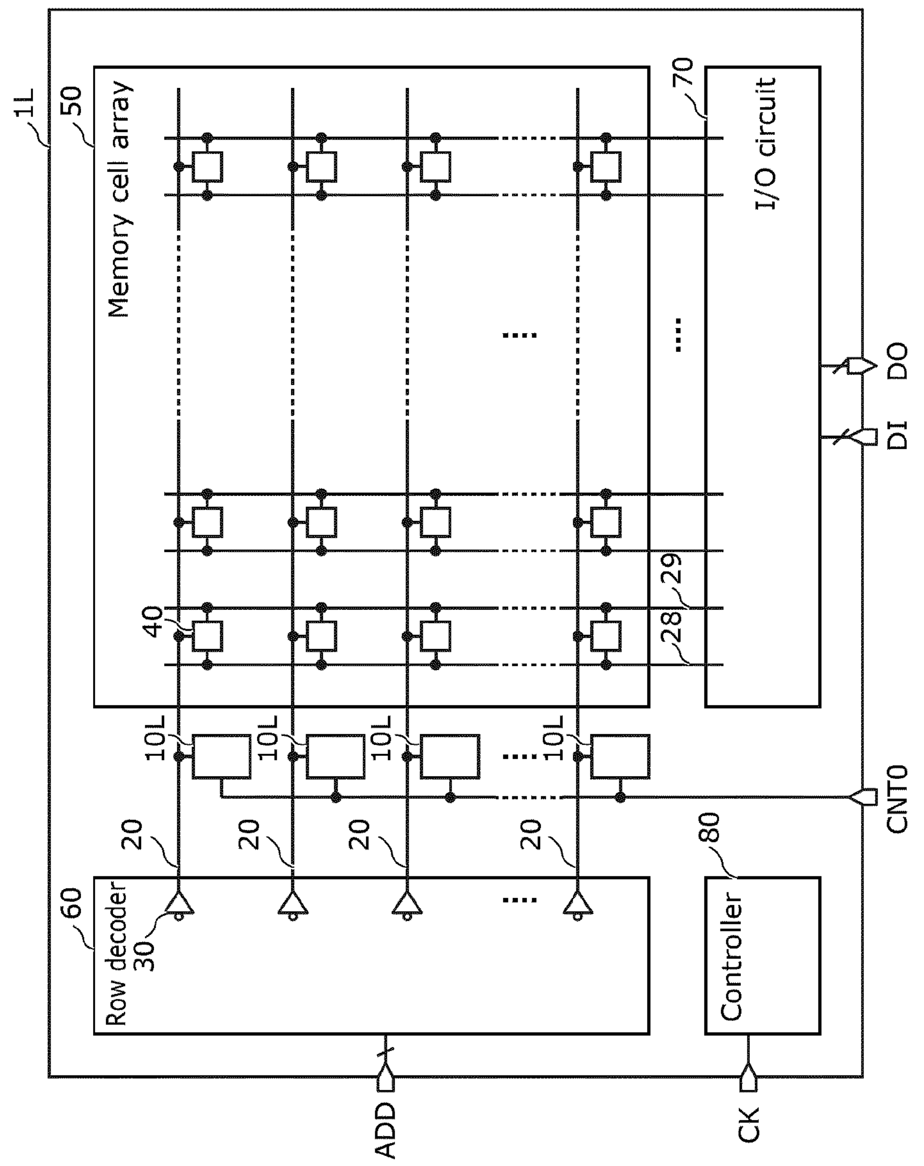
FIG. 27 is a block diagram illustrating a configuration of a semiconductor memory device according to Embodiment 12.

FIG. 27 is a block diagram illustrating a configuration of semiconductor memory device 1L according to Embodiment 12.

As illustrated in FIG. 27, semiconductor memory device 1L is configured by replacing assist circuit 10B in semiconductor memory device 1B according to Embodiment 3 with assist circuit 10L.

Here, first control signal input terminal CNT0 is connected to all the gates of first series connection n-channel MOS transistor 22L (see FIG. 28 described later) included in a plurality of assist circuits 10L and described later.

Figure 28:
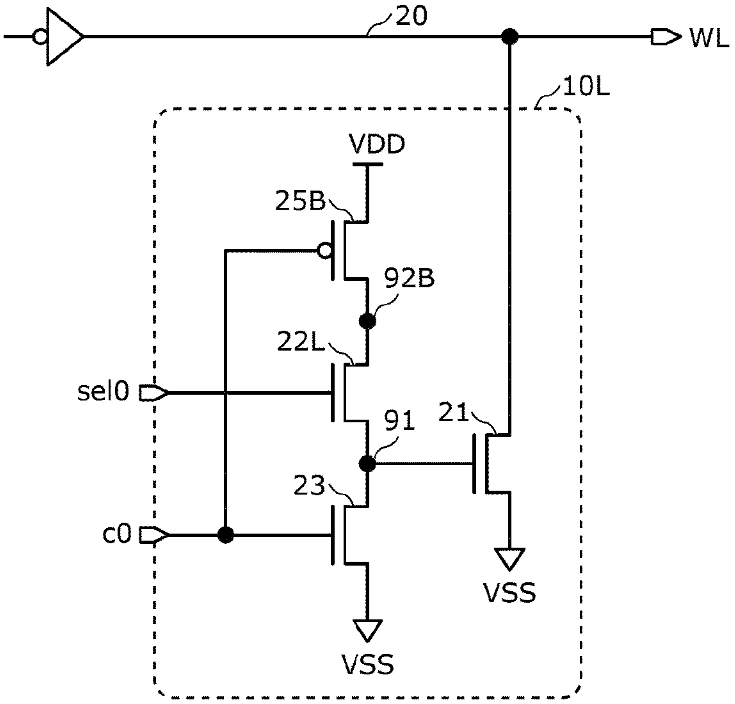
FIG. 28 is a circuit diagram illustrating a configuration of an assist circuit according to Embodiment 12.

FIG. 28 is a circuit diagram illustrating a configuration of assist circuit 10L.

As illustrated in FIG. 28, assist circuit 10L is configured by replacing first series connection n-channel MOS transistor 22B in assist circuit 10B according to Embodiment 3 with first series connection n-channel MOS transistor 22L.

Here, the threshold of first series connection n-channel MOS transistor 22L is lower than the threshold of first pull-down n-channel MOS transistor 21 and the threshold of second series connection n-channel MOS transistor 23.

<Observations>

In semiconductor memory device 1L configured as above, when a power supply voltage is set to a low voltage, the gate voltage of first pull-down n-channel MOS transistor 21 will be lower than the threshold voltage of first pull-down n-channel MOS transistor 21. As a result, an occurrence of inconvenience of first pull-down n-channel MOS transistor 21 not being able to pull down word line 20 is suppressed.

Thus, in semiconductor memory device 1L configured as above, it is possible to expand a low-voltage operation area for the pull-down operation of word line 20.

Embodiment 13

Hereinafter, a semiconductor memory device according to Embodiment 13 is described which is configured by changing a part of the configuration of semiconductor memory device 1B according to Embodiment 3.

Here, constituent elements in the semiconductor memory device according to Embodiment 13 that are similar to those of semiconductor memory device 1B are assigned the same reference signs as those already described, and detailed descriptions thereof will be omitted, with the descriptions focusing on the differences from semiconductor memory device 1B.

<Configuration>

Figure 29:
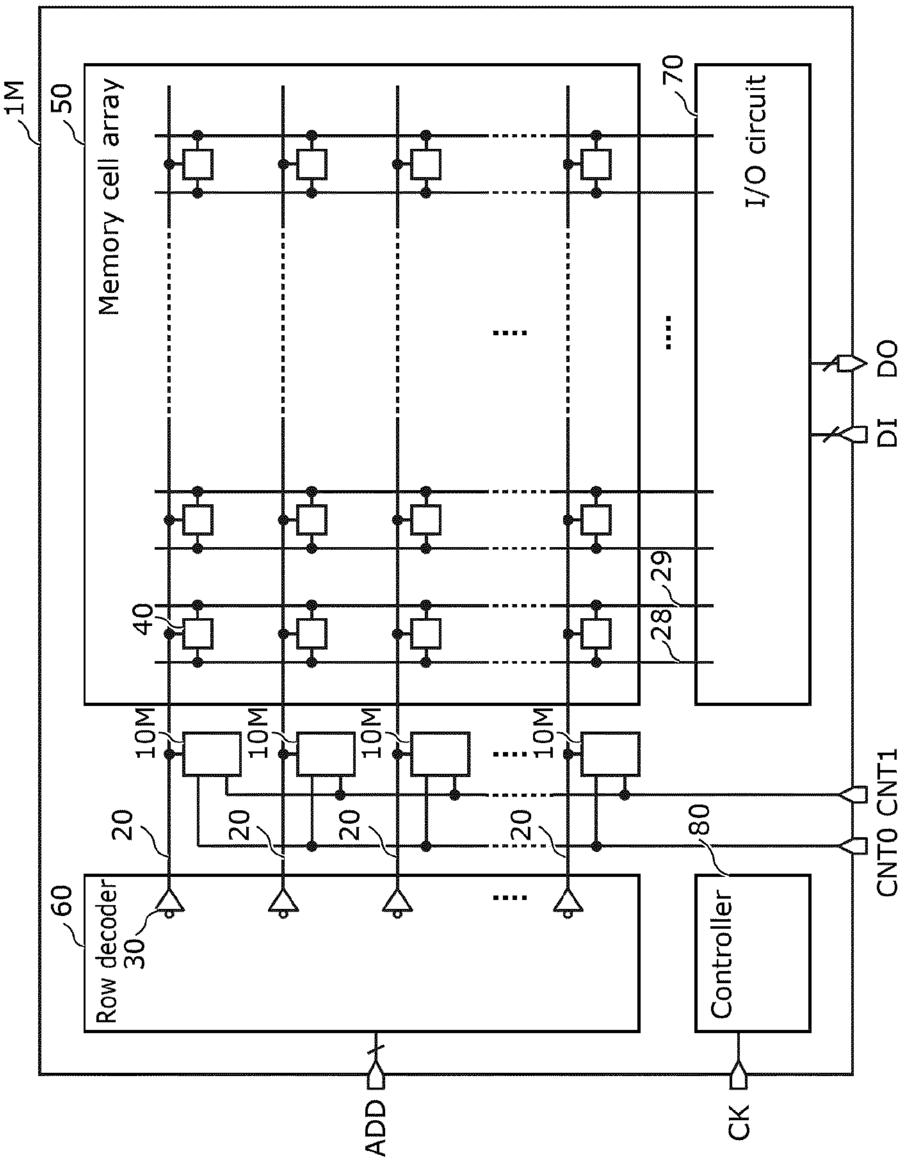
FIG. 29 is a block diagram illustrating a configuration of a semiconductor memory device according to Embodiment 13.

FIG. 29 is a block diagram illustrating a configuration of semiconductor memory device 1M according to Embodiment 13.

As illustrated in FIG. 29, semiconductor memory device 1M is configured by adding second control signal input terminal CNT1 to semiconductor memory device 1B according to Embodiment 3 and replacing assist circuit 10B in semiconductor memory device 1B with assist circuit 10M.

Here, first control signal input terminal CNT0 is connected to all the gates of first series connection n-channel MOS transistor 22B (see FIG. 30 described later) included in a plurality of assist circuits 10M and described later. Second control signal input terminal CNT1 is connected to all the gates of third series connection n-channel MOS transistor 22M (see FIG. 30 described later) included in the plurality of assist circuits 10M and described later.

Figure 30:
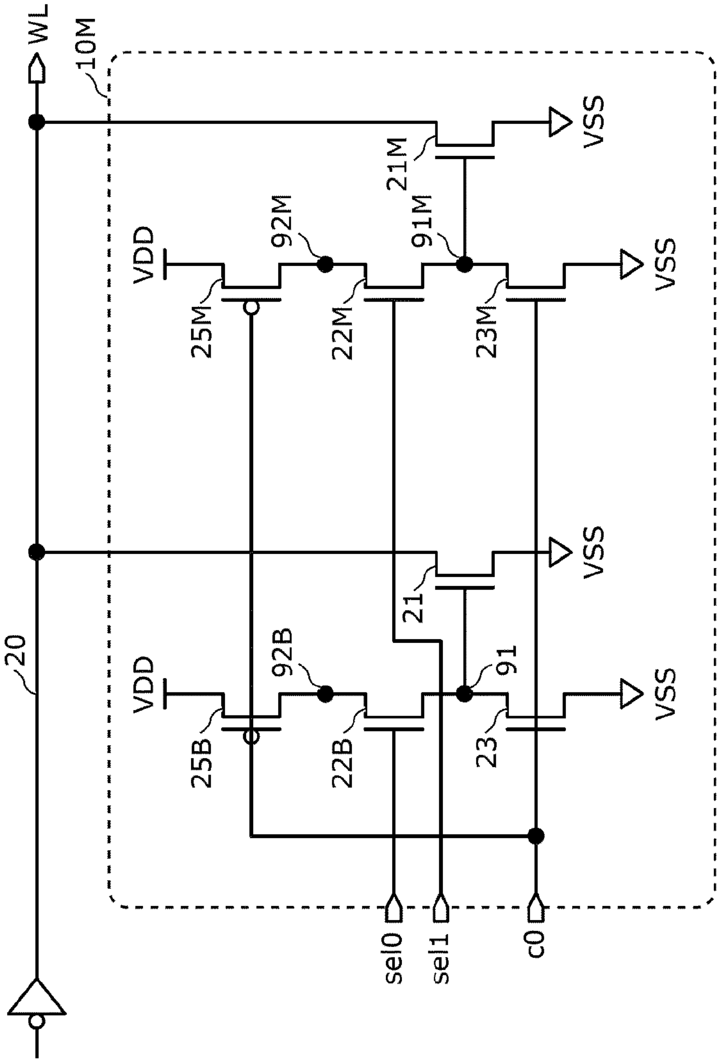
FIG. 30 is a circuit diagram illustrating a configuration of an assist circuit according to Embodiment 13.

FIG. 30 is a circuit diagram illustrating a configuration of assist circuit 10M.

As illustrated in FIG. 30, assist circuit 10M is configured by adding, to assist circuit 10B according to Embodiment 3, second pull-down n-channel MOS transistor 21M, second p-channel MOS transistor 25M, third series connection n-channel MOS transistor 22M, and fourth series connection n-channel MOS transistor 23M. The drain, source, and gate of second pull-down n-channel MOS transistor 21M are respectively connected to word line 20, a ground line, and third node 91M. The source and drain of second p-channel MOS transistors 25M are respectively connected to a power supply line and fourth node 92M. The drain and source of third series connection n-channel MOS transistor 22M are respectively connected to fourth node 92M and third node 91M. The drain and source of fourth series connection n-channel MOS transistor 23M are respectively connected to third node 91M and the ground line. Furthermore, a signal with the same logic as a signal to be input to the gate of second series connection n-channel MOS transistor 23 is input to the gate of second p-channel MOS transistors 25M and the gate of fourth series connection n-channel MOS transistor 23M.

Moreover, the gate of third series connection n-channel MOS transistor 22M is connected to second control signal input terminal CNT1 via terminal sell.

<Observations>

By controlling a first control signal, semiconductor memory device 1M configured as above can perform control as to whether to enable an assist function using first pull-down n-channel MOS transistor 21. By controlling a second control signal, semiconductor memory device 1M configured as above can perform control as to whether to enable an assist function using second pull-down n-channel MOS transistor 21M.

In this way, semiconductor memory device 1M configured as above can select from among the choices: (1) pulling down word line 20 by using first pull-down n-channel MOS transistor 21, (2) pulling down word line 20 by using second pull-down n-channel MOS transistor 21M, (3) pulling down word line 20 by using first pull-down n-channel MOS transistor 21 and second pull-down n-channel MOS transistor 21M, and (4) not pulling down word line 20.

Supplementary Notes

As described above, exemplifications of the techniques disclosed in the present application are described on the basis of Embodiments 1 to 13. However, the present disclosure is not limited to the embodiments. The scope of one or more aspects of the present disclosure may also encompass embodiments obtained by adding, to the embodiment, various modifications envisioned by those skilled in the art, and embodiments obtained by combining elements in different embodiments or variations, as long as the resultant embodiments do not depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to semiconductor memory devices.

The invention claimed is:

1. A semiconductor memory device comprising:
- a first pull-down n-channel metal-oxide-semiconductor (MOS) transistor that includes:
  - a drain connected to a first word line connected to one or more first memory cells;
  - a source connected to a ground line that supplies a ground voltage; and
  - a gate connected to a first node;
- a first series connection n-channel MOS transistor that includes:
  - a drain connected to a power supply line that supplies a power supply voltage; and
  - a source connected to the first node; and
- a second series connection n-channel MOS transistor that includes:
  - a drain connected to the first node; and
  - a source connected to the ground line, wherein
- an inverse-logic signal of a signal to be input to a gate of the second series connection n-channel MOS transistor is input to a gate of the first series connection n-channel MOS transistor.

2. The semiconductor memory device according to claim 1, further comprising:
- a first p-channel MOS transistor that includes:
  - a drain connected to the drain of the first series connection n-channel MOS transistor;
  - a source connected to the power supply line; and
  - a gate connected to a first control signal input terminal to which a first control signal is to be input, wherein
- the drain of the first series connection n-channel MOS transistor is connected to the power supply line via the first p-channel MOS transistor.

3. The semiconductor memory device according to claim 2, further comprising:
- a second pull-down n-channel MOS transistor that includes:
  - a drain connected to a second word line connected to one or more second memory cells;
  - a source connected to the ground line; and
  - a gate connected to a second node;
- a third series connection n-channel MOS transistor that includes:
  - a drain connected to the drain of the first p-channel MOS transistor; and
  - a source connected to the second node; and
- a fourth series connection n-channel MOS transistor that includes:
  - a drain connected to the second node; and
  - a source connected to the ground line, wherein
- an inverse-logic signal of a signal to be input to a gate of the fourth series connection n-channel MOS transistor is input to a gate of the third series connection n-channel MOS transistor.

4. The semiconductor memory device according to claim 2, further comprising:
- a second pull-down n-channel MOS transistor that includes:

a drain connected to a second word line connected to one or more second memory cells;

a source connected to the ground line; and a gate connected to the first node;

a third pull-down n-channel MOS transistor that includes:

a drain connected to a third word line connected to one or more third memory cells;

a source connected to the ground line; and a gate connected to a second node;

a fourth pull-down n-channel MOS transistor that includes:

a drain connected to a fourth word line connected to one or more fourth memory cells;

a source connected to the ground line; and a gate connected to the second node;

a third series connection n-channel MOS transistor that includes:

a drain connected to the drain of the first p-channel MOS transistor; and a source connected to the second node; and a fourth series connection n-channel MOS transistor that includes:

a drain connected to the second node; and a source connected to the ground line, wherein when at least one of the first word line or the second word line is active, an inverse-logic signal of a signal to be input to the gate of the second series connection n-channel MOS transistor is input to the gate of the first series connection n-channel MOS transistor, and when at least one of the third word line or the fourth word line is active, an inverse-logic signal of a signal to be input to a gate of the fourth series connection n-channel MOS transistor is input to a gate of the third series connection n-channel MOS transistor.

5. The semiconductor memory device according to claim 2, further comprising:

a second pull-down n-channel MOS transistor that includes:

a drain connected to the first word line;

a source connected to the ground line; and a gate connected to a second node;

a second p-channel MOS transistor that includes:

a drain connected to a third node;

a source connected to the power supply line; and a gate connected to a second control signal input terminal to which a second control signal is to be input;

a third series connection n-channel MOS transistor that includes:

a drain connected to the third node; and a source connected to the second node; and a fourth series connection n-channel MOS transistor that includes:

a drain connected to the second node; and a source connected to the ground line, wherein a signal with same logic as a signal to be input to a gate of the third series connection n-channel MOS transistor is input to the gate of the first series connection n-channel MOS transistor, and a signal with same logic as a signal to be input to a gate of the fourth series connection n-channel MOS transistor is input to the gate of the second series connection n-channel MOS transistor.

6. A semiconductor memory device comprising:

a first pull-down n-channel metal-oxide-semiconductor (MOS) transistor that includes:

a drain connected to a first word line connected to one or more first memory cells;

a source connected to a ground line that supplies a ground voltage; and a gate connected to a first node;

a first p-channel MOS transistor that includes:

a source connected to a power supply line that supplies a power supply voltage; and a drain connected to a second node;

a first series connection n-channel MOS transistor that includes:

a drain connected to the second node;

a source connected to the first node; and a gate connected to a first control signal input terminal to which a first control signal is to be input; and a second series connection n-channel MOS transistor that includes:

a drain connected to the first node; and a source connected to the ground line, wherein a signal with same logic as a signal to be input to a gate of the second series connection n-channel MOS transistor is input to a gate of the first p-channel MOS transistor.

7. The semiconductor memory device according to claim 6, further comprising:

a second pull-down n-channel MOS transistor that includes:

a drain connected to a second word line connected to one or more second memory cells;

a source connected to the ground line; and a gate connected to the first node.

8. The semiconductor memory device according to claim 6, further comprising:

a second pull-down n-channel MOS transistor that includes:

a drain connected to the first word line;

a source connected to the ground line; and a gate connected to the power supply line.

9. The semiconductor memory device according to claim 6, wherein a threshold of the first series connection n-channel MOS transistor is lower than a threshold of the first pull-down n-channel MOS transistor and a threshold of the second series connection n-channel MOS transistor.

10. The semiconductor memory device according to claim 6, further comprising:

a second pull-down n-channel MOS transistor that includes:

a drain connected to the first word line;

a source connected to the ground line; and a gate connected to a third node;

a second p-channel MOS transistor that includes:

a source connected to the power supply line; and a drain connected to a fourth node;

a third series connection n-channel MOS transistor that includes:

a drain connected to the fourth node;

a source connected to the third node; and a gate connected to a second control signal input terminal to which a second control signal is to be input; and a fourth series connection n-channel MOS transistor that includes:

a drain connected to the third node; and a source connected to the ground line, wherein a signal with same logic as a signal to be input to the gate of the second series connection n-channel MOS transistor is input to a gate of the second p-channel MOS transistor and a gate of the fourth series connection n-channel MOS transistor.

11. The semiconductor memory device according to claim 2, further comprising:

a second pull-down n-channel MOS transistor that includes:

a drain connected to a second word line connected to one or more second memory cells;

a source connected to the ground line; and a gate connected to the first node.

12. The semiconductor memory device according to claim 2, further comprising:

a second pull-down n-channel MOS transistor that includes:

a drain connected to the first word line;

a source connected to the ground line; and a gate connected to the power supply line.

13. The semiconductor memory device according to claim 2, wherein a threshold of the first series connection n-channel MOS transistor is lower than a threshold of the first pull-down n-channel MOS transistor and a threshold of the second series connection n-channel MOS transistor.

* * * * *